(12) United States Patent
Park et al.

(10) Patent No.: US 10,699,900 B2
(45) Date of Patent: Jun. 30, 2020

(54) METHOD FOR FORMING THIN FILM

(71) Applicant: WONIK IPS CO., LTD., Pyeongtaek-si, Gyeonggi-do (KR)

(72) Inventors: Sang Jun Park, Yongin-si (KR); Tae Ho Jeon, Pyeongtaek-si (KR); Sang Jin Lee, Pyeongtaek-si (KR); Chang Hee Han, Pyeongtaek-si (KR); Tae Ho Kim, Osan-si (KR)

(73) Assignee: WONIK IPS CO., LTD., Pyeongtaek-si, Gyeonggi-do (KR)

( * ) Notice: Subject to any disclaimer, the term of this patent is extended or adjusted under 35 U.S.C. 154(b) by 0 days.

(21) Appl. No.: 16/409,542

(22) Filed: May 10, 2019

(65) Prior Publication Data

US 2019/0348274 A1 Nov. 14, 2019

(30) Foreign Application Priority Data

| | | |
|---|---|---|
| May 11, 2018 | (KR) | 10-2018-0054513 |
| May 11, 2018 | (KR) | 10-2018-0054514 |
| May 30, 2018 | (KR) | 10-2018-0062143 |
| Jun. 19, 2018 | (KR) | 10-2018-0070330 |

(51) Int. Cl.
| | |
|---|---|
| *H01L 21/02* | (2006.01) |
| *H01L 21/311* | (2006.01) |
| *C23C 16/455* | (2006.01) |
| *C23C 16/52* | (2006.01) |

(52) U.S. Cl.
CPC .... *H01L 21/0228* (2013.01); *C23C 16/45536* (2013.01); *C23C 16/45544* (2013.01); *C23C 16/52* (2013.01); *H01L 21/02189* (2013.01); *H01L 21/31122* (2013.01)

(58) Field of Classification Search
CPC .......... H01L 21/0228; H01L 21/02189; H01L 21/31122; H01L 27/115; H01L 21/02356; H01L 21/02178; C23C 16/45536; C23C 16/52; C23C 16/45544; C23C 16/45534; C23C 16/45548; C23C 16/56; C23C 16/403; C23C 16/405
See application file for complete search history.

(56) References Cited

U.S. PATENT DOCUMENTS

| | | | | |
|---|---|---|---|---|
| 2017/0365478 | A1* | 12/2017 | George | ..................... C23F 1/12 |
| 2018/0076087 | A1* | 3/2018 | Yamauchi | ......... C23C 16/45525 |
| 2019/0203354 | A1* | 7/2019 | Smith | .................... B60J 7/1621 |

* cited by examiner

*Primary Examiner* — Nadine G Norton
*Assistant Examiner* — Mahmoud Dahimene
(74) *Attorney, Agent, or Firm* — William Park & Associates Ltd.

(57) ABSTRACT

Provided is a method for forming a thin film. The method for forming the thin film includes forming a first thin film having a first thickness with first crystallinity through an atomic layer deposition process and etching the first thin film by a predetermined thickness through an atomic layer etching process with respect to the first thin film to form a second thin film having a second thickness less than the first thickness.

20 Claims, 12 Drawing Sheets

METHOD FOR FORMING THIN FILM

CROSS-REFERENCE TO RELATED APPLICATIONS

This application claims priorities to Korean Patent Application No. 10-2018-0054513 filed on May 11, 2018, Korean Patent Application No. 10-2018-0054514 filed on May 11, 2018, Korean Patent Application No. 10-2018-0062143 filed on May 30, 2018, and Korean Patent Application No. 10-2018-0070330 filed on Jun. 19, 2018, and all the benefits accruing therefrom under 35 U.S.C. § 119, the contents of which are incorporated by reference in their entireties.

BACKGROUND

The present disclosure relates to a semiconductor process, and more particularly, to a method for forming a thin film by using an atomic layer deposition (ALD) process and an atomic layer etching (ALE) process.

In recent years, as semiconductor devices are highly integrated, thin films used in the semiconductor devices have become thinner. Particularly, when the ALD process is applied, the thickness of each of the thin films may be controlled in a unit of an atomic or molecular layer. However, when the thin film is thin, it is difficult to meet the required physical properties. For example, if the thin film is thinned to a predetermined thickness or less, the crystallinity is deteriorated to deteriorate leakage current characteristics. However, if the thickness of the thin film increases to improve the leakage current characteristics, it is difficult to secure the required permittivity or capacitance.

SUMMARY

The present disclosure provides a method for forming a thin film, which is capable of securing thin film characteristics required for a thin film having a thin thickness. However, this may be merely illustrative, and thus the present disclosure is not limited thereto.

In accordance with an embodiment, a method for forming a thin film includes: forming a first thin film having a first thickness with first crystallinity through an atomic layer deposition process; and etching the first thin film by a predetermined thickness through an atomic layer etching process with respect to the first thin film to form a second thin film having a second thickness less than the first thickness. Crystallinity of the second thin film may be greater than that of a third thin film, which is formed at the second thickness on a substrate under the same condition as the atomic layer deposition process.

The atomic layer etching process in the forming of the second thin film may be performed in situ by following the atomic layer deposition process in the same chamber as the atomic layer deposition process in the forming of the first thin film.

The atomic layer deposition process in the forming of the first thin film and the atomic layer etching process in the forming of the second thin film may be performed in one chamber by alternately supplying a deposition gas and an etching gas through gas supply holes, which are separated from each other in a gas supply unit, while rotating a substrate.

In the forming of the first thin film, the atomic layer deposition process may be performing by repeatedly performing a unit cycle including: supplying a source gas to the substrate; supplying a first purge gas to the substrate; supplying a reaction gas to the substrate; and supplying a second purge gas to the substrate.

Each of the first thin film and the second thin film may include zirconium oxide, and the source gas comprises a zirconium source gas, and the reaction gas may include an oxygen-based reaction gas, which reacts with the zirconium source gas to generate zirconium oxide.

Each of the first thin film and the second thin film may include aluminum oxide, and the source gas comprises an aluminum source gas, and the reaction gas may include an oxygen-based reaction gas, which reacts with the aluminum source gas to generate aluminum oxide.

In the forming of the second thin film, the atomic layer etching process may be performing by repeatedly performing a unit cycle including: supplying a surface processing gas to the substrate; supplying a first purge gas to the substrate; supplying an etching gas to the substrate; and supplying a second purge gas to the substrate.

Each of the first thin film and the second thin film may include zirconium oxide, the surface processing gas may include a fluorine-based surface processing gas for surface-processing the zirconium oxide with zirconium fluoride, and the etching gas may include an organic reaction gas, which reacts with the zirconium fluoride to generate a volatile zirconium compound.

Each of the first thin film and the second thin film may include aluminum oxide, the surface processing gas may include a fluorine-based surface processing gas for surface-processing the aluminum oxide with aluminum fluoride, and the etching gas may include an organic reaction gas, which reacts with the aluminum fluoride to generate a volatile aluminum compound.

The fluorine-based surface processing gas may include one selected from the group consisting of HF, $NF_3$, and $F_2$ or a combination thereof, and the organic reaction gas may include one selected from the group consisting of trimethylamine (TMA), dimethylacetamide (DMAC), silicon tetrachloride ($SiCl_4$), and $Sn(acac)_2$ gases or a combination thereof.

In the forming of the first thin film, the atomic layer deposition process may be performed in a first process chamber within a substrate processing apparatus, and in the forming of the second thin film, the atomic layer etching process may be performed in a second process chamber, which is different from the first process chamber, within the substrate processing apparatus.

The method may further include, after the forming of the first thin film, transferring the substrate from the first process chamber to the second process chamber.

In accordance with another embodiment, a method for forming a thin film includes: transferring a substrate into a first process chamber within a substrate processing apparatus; forming a first thin film having a first thickness with first crystallinity on the substrate through an atomic layer deposition process in the first process chamber; transferring the substrate into a second process chamber, which is different from the first process chamber, within the substrate processing apparatus; and etching the first thin film by a predetermined thickness through an atomic layer etching process with respect to the first thin film in the second process chamber to form a second thin film having a second thickness less than the first thickness, wherein crystallinity of the second thin film is greater than that of a third thin film, which is formed at the second thickness on the substrate under the same condition as the atomic layer deposition process.

The transferring of the substrate from the first processing chamber into the second process chamber may be performed by transferring the substrate from the first process chamber into the second process chamber via a transfer chamber, which is connected to the first process chamber and the second process chamber within the substrate processing apparatus through gates, under a vacuum environment.

In accordance with yet another embodiment, an apparatus for processing a substrate includes: a chamber configured to provide a substrate processing space therein; a substrate support unit rotatably installed in the chamber to radially seat a plurality of substrates on an upper portion thereof in a rotating direction; a gas supply unit installed in the chamber to face the substrate support unit so as to supply a plurality of gases to the substrate support unit; and a control unit configured to control an operation of the substrate support unit and the gas supply of the gas supply unit. The gas supply unit may include a first deposition gas supply part, a first etching gas supply part, a first purge part, a second deposition gas supply part, a second etching gas supply part, and a second purge part. The control unit may selectively drive the first deposition gas supply part and the second deposition gas supply part while rotating the substrate support unit when the atomic layer deposition process of forming the thin film on the substrates is performed to control the gas supply unit so that the deposition gases are alternately supplied to the substrates and selectively drive the first etching gas supply part and the second etching gas supply part while rotating the substrate support unit when the atomic layer etching process is performed to control the gas supply unit so that the etching gases are alternately supplied to the substrates.

One of the first purge part and the second purge part 136 may be disposed between the first process gas supply part and the third process gas supply part, and the other one may be disposed between the third process gas supply part and the first process gas supply part in radial order.

In the atomic layer deposition process, the first deposition gas supply part may supply a source gas to the substrates on a substrate support, the second deposition gas supply part may supply a reaction gas, which reacts with the source gas to form a thin film, to the substrates on the substrate support, one of the first purge part and the second purge part may purge the source gas, and the other one may purge the reaction gas.

One of the first purge part and the second purge part may be disposed between the first etching gas supply part and the second etching gas supply part, and the other one may be disposed between the second etching gas supply part and the first etching gas supply part in radial order.

In the atomic layer etching process, the second etching gas supply part may supply a surface processing gas for surface-processing the thin film to the substrates on the substrate support, the first etching gas supply part may supply an etching gas, which reacts with the surface-processed portion of the thin film to remove the thin film, to the substrates on the substrate support, one of the first purge part and the second purge part may purge the surface processing gas, and the other one may purge the etching gas.

The second etching gas supply part may further include an E-beam supply part for radicalizing the surface processing gas.

The substrate processing apparatus may include a first spacing part between the first deposition gas supply part and the first etching gas supply part and a second spacing part between the second deposition gas supply part and the second etching gas supply part.

The control unit may control the substrate support unit and the gas supply unit so that a thin film having a first thickness with first crystallinity is formed on the substrates through the atomic layer deposition process and then etched by a predetermined thickness in situ through the atomic layer etching process after the atomic layer deposition process to form a thin film having a second thickness less than the first thickness while maintaining the first crystallinity.

In the atomic layer deposition process, the control unit may control the substrate support unit and the gas supply unit so that the first deposition gas supply part supplies a zirconium source gas, and the second deposition gas supply part supplies an oxygen-based reaction gas, which reacts with the zirconium source gas to generate zirconium oxide, to form the zirconium oxide on the substrates.

In the atomic layer etching process, the control unit may control may control the substrate support unit and the gas supply unit so that the second etching gas supply part supplies a fluorine-based surface processing gas for surface-processing the zirconium oxide with zirconium fluoride, and the first etching gas supply part supplies an organic reaction gas, which reacts with the zirconium fluoride to generate a volatile zirconium compound, to etch the zirconium oxide on the substrates by a predetermined thickness.

In accordance with still another embodiment, an apparatus for processing a substrate includes: a chamber configured to provide a substrate processing space therein; a substrate support unit rotatably installed in the chamber to radially seat a plurality of substrates on an upper portion thereof in a rotating direction; a gas supply unit installed in the chamber to face the substrate support unit so as to supply a plurality of gases to the substrate support unit; and a control unit configured to control an operation of the substrate support unit and the gas supply of the gas supply unit. The gas supply unit may include a first process gas supply part, a first purge part, a second deposition gas supply part, a third process gas supply part, and a second purge part. The control unit may selectively drive the first process gas supply part and the second process gas supply part while rotating the substrate support unit when the atomic layer deposition process of forming the thin film on the substrates is performed to control the gas supply unit so that the deposition gases are alternately supplied to the substrates and selectively drive the first process gas supply part and the third process gas supply part, and the second purge part while rotating the substrate support unit when the atomic layer etching process is performed to control the gas supply unit so that the etching gases are alternately supplied to the substrates.

One of the first purge part and the second purge part may be disposed between the first process gas supply part and the second process gas supply part, and the other one may be disposed between the second process gas supply part and the first process gas supply part in radial order.

In the atomic layer deposition process, the first process gas supply part may supply a source gas to the substrates on a substrate support, the second process gas supply part may supply a reaction gas, which reacts with the source gas to form a thin film, to the substrates on the substrate support, one of the first purge part and the second purge part may purge the source gas, and the other one may purge the reaction gas.

One of the first purge part and the second purge part may be disposed between the first process gas supply part and the third process gas supply part, and the other one may be disposed between the third process gas supply part and the first process gas supply part in radial order.

In the atomic layer etching process, the third process gas supply part may supply a surface processing gas for surface-processing the thin film to the substrates on the substrate support, the first process gas supply part may supply an etching gas, which reacts with the surface-processed portion of the thin film to remove the thin film, to the substrates on the substrate support, one of the first purge part and the second purge part may purge the surface processing gas, and the other one may purge the etching gas.

The third process gas supply part may include an E-beam supply part for radicalizing the surface processing gas.

The apparatus may include a spacing part between the second process gas supply part and the third process gas supply part.

In the atomic layer deposition process, the control unit may control the substrate support unit and the gas supply unit so that the first process gas supply part supplies an aluminum source gas, and the second process gas supply part supplies an oxygen-based reaction gas, which reacts with the aluminum source gas to generate aluminum oxide, to form the aluminum oxide on the substrates.

In the atomic layer etching process, the control unit may control the substrate support unit and the gas supply unit so that the third process gas supply part supplies a fluorine-based surface processing gas for surface-processing the aluminum oxide with aluminum fluoride, and the first process gas supply part supplies the same organic reaction gas as the aluminum source gas, which reacts with the aluminum fluoride to generate a volatile aluminum compound, to etch the aluminum oxide on the substrates by a predetermined thickness.

BRIEF DESCRIPTION OF THE DRAWINGS

Embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings.

The present invention may, however, be embodied in many different forms and should not be construed as being limited to the embodiments set forth herein; rather, these embodiments are provided so that those skilled in the art thoroughly understand the present invention. Rather, these embodiments are provided so that this disclosure will be thorough and complete, and will fully convey the scope of the present disclosure to those skilled in the art. Also, in the figures, a thickness or dimension of each of layers is exaggerated for clarity of illustration.

Figure 1:
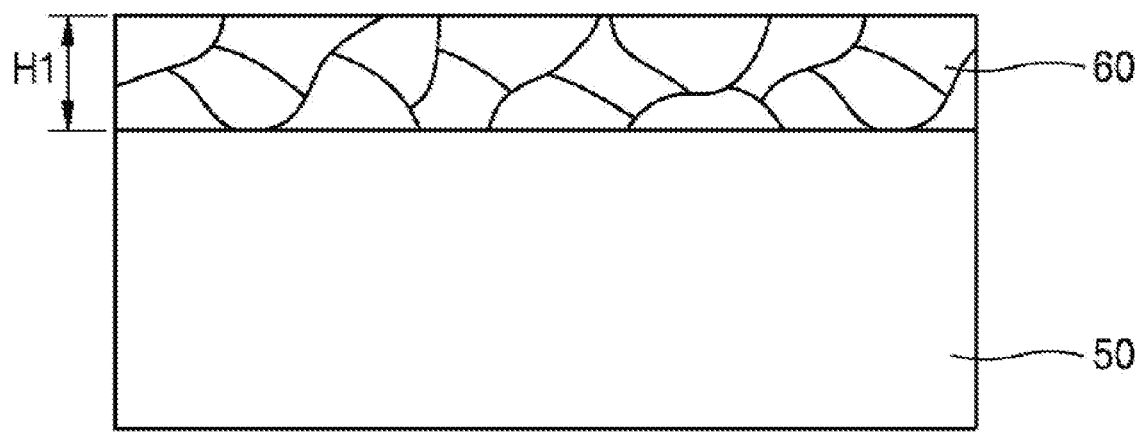
FIG. 1 is a schematic cross-sectional view illustrating formation of a first thin film by using an atomic layer deposition process in accordance with an embodiment.
Figure 2:
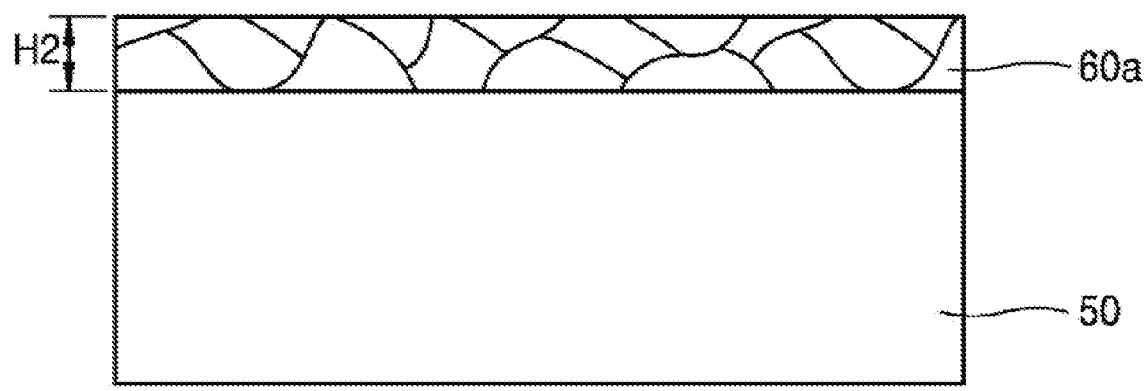
FIG. 2 is a schematic cross-sectional view illustrating formation of a second thin film by using an atomic layer etching process in accordance with an embodiment.

FIG. 1 is a schematic cross-sectional view illustrating formation of a first thin film by using an atomic layer deposition process in accordance with an embodiment, and FIG. 2 is a schematic cross-sectional view illustrating formation of a second thin film by using an atomic layer etching process in accordance with an embodiment.

Referring to FIG. 1, a first thin film 60 having a first thickness H1 with first crystallinity may be formed on a substrate 50 through an atomic layer deposition process.

The atomic layer deposition (ALD) process may be referred to as a process of forming a thin film by repeatedly performing a cycle in which a source gas is adsorbed to the substrate 50, a residual source gas is purged, a reaction gas is supplied to the substrate 50, and a residual reaction gas is purged to form a unit thin film on the substrate.

The ALD process may include a time division manner in which supply of the source gas, the reaction gas, and a purge gas are controlled in units of time and a spatial division manner in which the supply of the source gas, the reaction gas, and the purge gas to the substrate is controlled through relative movement of the gas supply unit and the substrate.

Referring to FIG. 2, the ALD process may be performed on the first thin film (see reference numeral 60 of FIG. 1) to etch the first thin film 60 by a predetermined thickness, thereby forming a second thin film 60a having a second thickness H2 less than a first thickness H1.

The atomic layer etching (ALE) process may be referred to as a process of etching the thin film by repeatedly performing a cycle in which a surface processing gas is supplied to the substrate 50 to process a surface of the thin film on the substrate 50, a residual surface processing gas is purged, an etching gas is supplied to the substrate 50 so that the surface-processed portion of the thin film reacts with the etching gas so as to be removed, a residual etching gas is purged to remove a unit thin film.

The ALE process may include a time division manner in which supply of the surface processing gas, the etching gas, and the purge gas are controlled in units of time and a spatial division manner in which the supply of the surface processing gas, the etching gas, and the purge gas to the substrate is controlled through relative movement of the gas supply unit and the substrate.

In accordance with embodiments, the ALD process and the ALE process may be performed in the same chamber within the same substrate processing apparatus or may be performed in different chambers within the same substrate processing apparatus. For example, the ALE process in the process of forming the second thin film 60*a* may be performed in situ by following the ALD process in the same chamber as the ALD process in the process of forming the first thin film 60.

Hereinafter, a method for forming a thin film by using one substrate processing apparatus in accordance with an embodiment will be described in more detail.

Figure 3:
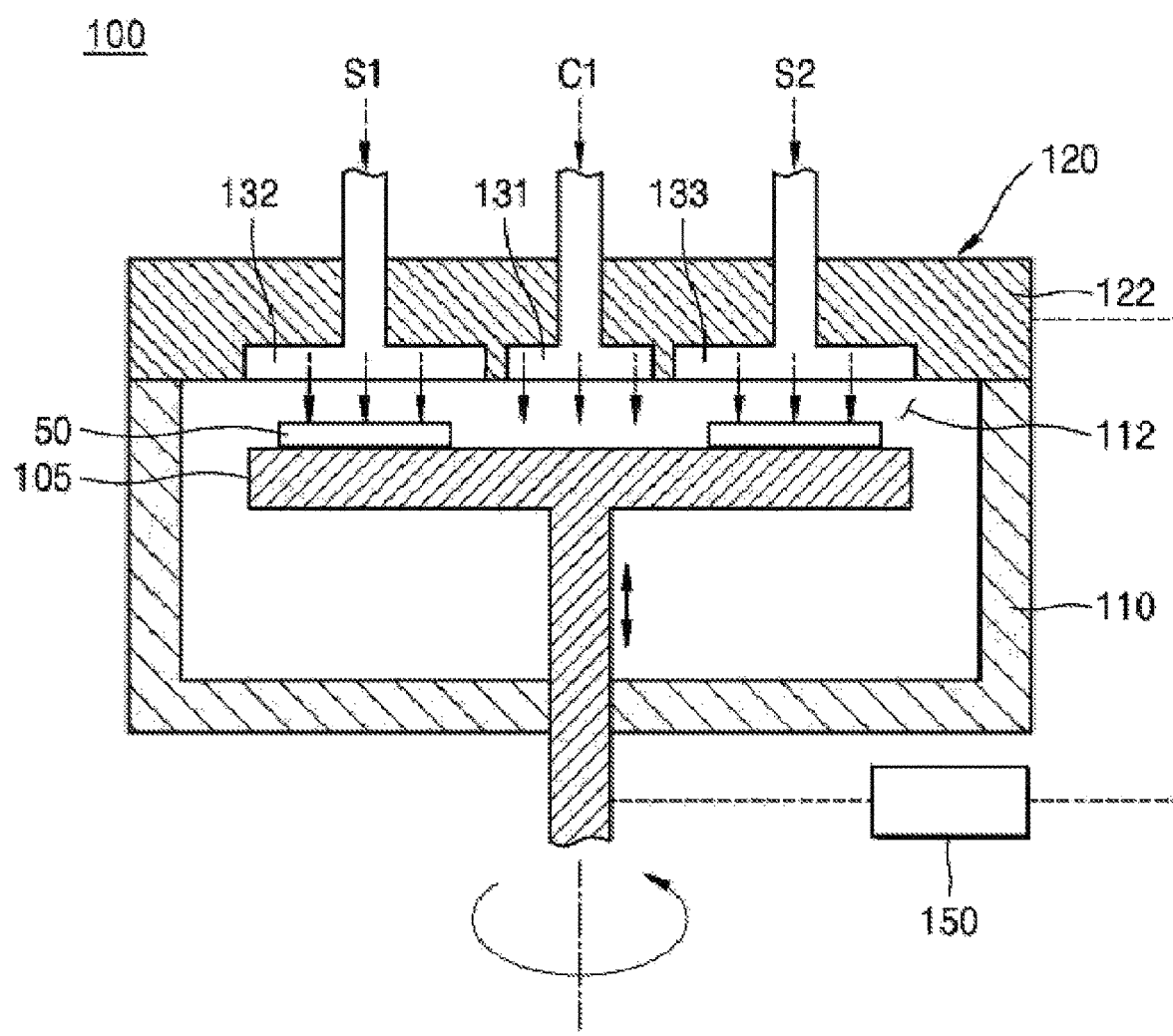
FIG. 3 is a schematic cross-sectional view of a substrate processing apparatus for realizing a method for forming the thin film in accordance with an embodiment.

FIG. 3 is a schematic cross-sectional view of a substrate processing apparatus 100 for realizing a method for forming the thin film in accordance with an embodiment. The substrate processing apparatus 100 of FIG. 3 is illustrated as an example of an apparatus for realizing the spatial-division ALD and ALE processes in one chamber in situ.

Referring to FIG. 3, the substrate processing apparatus 100 may include a chamber 110, a substrate support unit 105, a gas supply unit 120, and a control unit 150.

The chamber 110 may provide a substrate processing space 112 therein. For example, the substrate processing space 112 of the chamber 110 may be connected to a pumping unit (not shown) to provide a vacuum environment.

The substrate support unit 105 may be rotatably installed in the chamber 110, and a plurality of substrates 50 may be radially seated on an upper portion of the substrate support unit 105 in a rotating direction. For example, the substrate support unit 105 may include a shaft part coupled to be sealed from the outside to the inside of the chamber 110 and receiving rotation power so as to be rotated and an upper plate part coupled to the shaft part. Seating grooves in which substrates 50 are seated may be radially disposed in the upper plate part. When the substrates 50 are wafers, each of the seating grooves may have a circular shape.

The gas supply unit 120 may be installed to face the substrate support unit 105, thereby supplying a plurality of gases to the substrate support unit 105. For example, the gas supply unit 120 may include a main body 122 having a shower head shape, and the main body 121 may be coupled to an upper portion of the chamber 110.

The control unit 150 may perform an overall control of the substrate processing apparatus 100. For example, the control unit 150 may control an operation of the substrate support unit 105 and gas supply of the gas supply unit 120.

When the above-described substrate processing apparatus 100 is used, the ALD process in the process of forming the first thin film 60 and the ALE process in the process of etching the first thin film 60 by a predetermined thickness to form the second thin film 60*a* may be performed in one chamber by alternately supplying a deposition gas and an etching gas through gas supply holes, which are separated from each other in the gas supply unit 120, while rotating the substrate 50.

Figure 4:
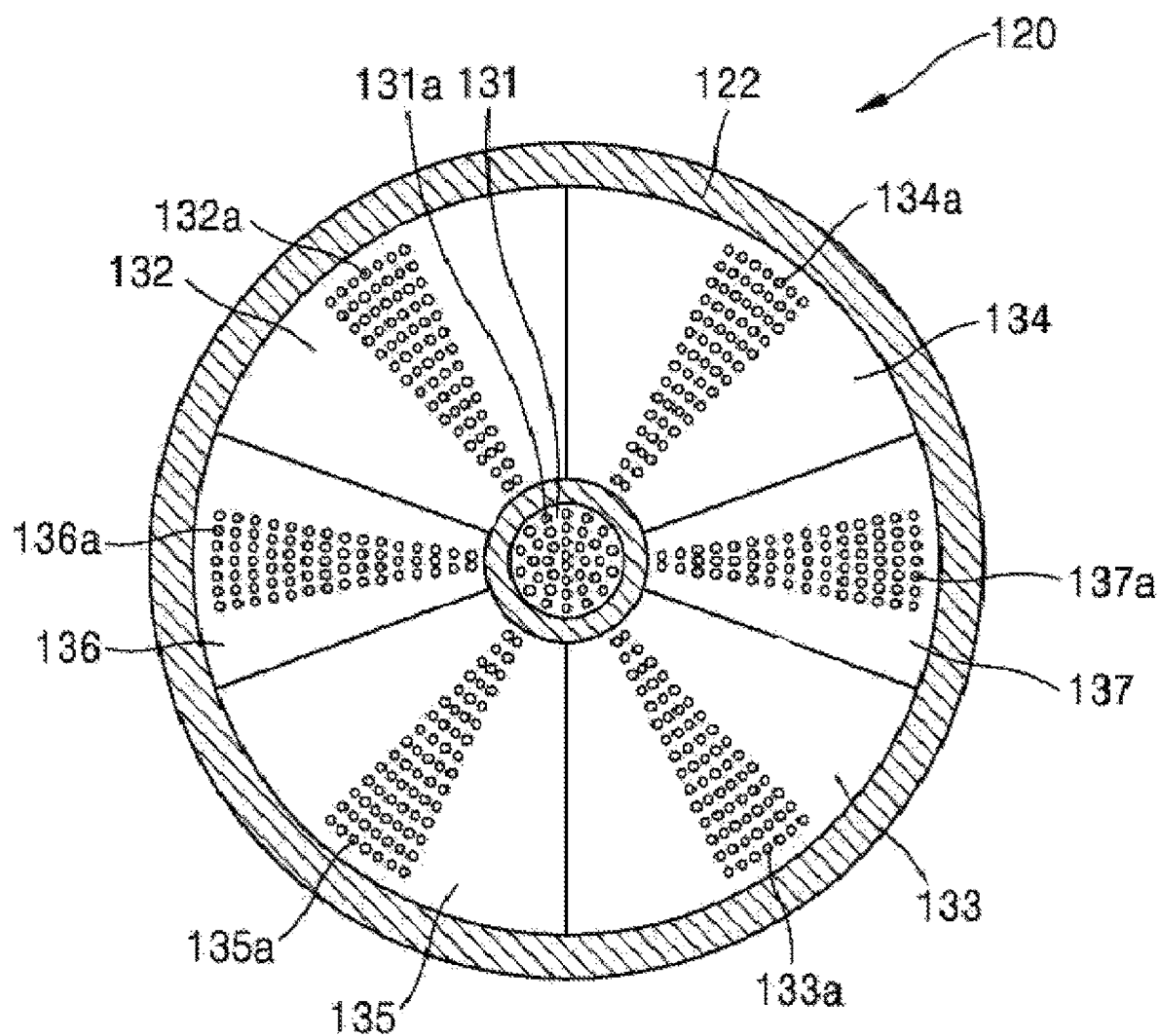
FIG. 4 is a schematic plan view illustrating an example of a gas supply unit of the substrate processing apparatus of FIG. 3.

FIG. 4 is a schematic plan view illustrating an example of the gas supply unit of the substrate processing apparatus of FIG. 3.

Referring to FIGS. 3 and 4, the gas supply unit 120 may include a first deposition gas supply part 132, a first etching gas supply part 134, a first purge part 137, a second deposition gas supply part 133, a second etching gas supply part 135, and a second purge part 136, which are radially separated from each other. Alternatively, the gas supply unit 120 may further include a curtain gas supply part 131 at a central portion thereof.

A plurality of first deposition gas supply holes 132*a* may be defined in the first deposition gas supply part 132, and a plurality of second deposition gas supply holes 133*a* may be defined in the second deposition gas supply part 133. A plurality of etching gas supply holes 134*a* may be defined in the first etching gas supply part 134, and a plurality of second etching gas supply holes 135*a* may be defined in the second etching gas supply part 135. A plurality of purge holes 137*a* may be defined in the first purge part 137, and a plurality of second purge holes 136*a* may be defined in the second purge part 136.

For example, the gas supply unit 120 may have an approximately circular shape. The first deposition gas supply part 132, the first etching gas supply part 134, the first purge part 137, the second deposition gas supply part 133, the second etching gas supply part 135, and the second purge part 136 may have a shape in which the circular gas supply unit 120 is divided into a circular arc shape. That is, the gas supply unit 120 may correspond to be spatially divided with respect to the substrates 50 on the rotating substrate support unit 150. In this sense, the substrate processing apparatus 100 may be referred to as a spatial division type facility.

The substrate processing apparatus 100 may be provided to selectively perform the ALD process and the ALE process.

Thus, in the ALD process, the first deposition gas supply part 132 and the second deposition gas supply part 133 may selectively operate. In the ALE process, the first etching gas supply part 134 and the second etching gas supply part 135 may selectively operate. Thus, in the ALD process, gas supply may be interrupted so that the first etching gas supply part 134 and the second etching gas supply part 135 do not operate. In the ALE process, gas supply may be interrupted so that the first deposition gas supply part 132 and the second deposition gas supply part 133 do not operate.

For example, the control unit 150 may selectively drive the first deposition gas supply part 132, the first purge part 137, the second deposition gas supply part 133, and the second purge part 136 while rotating the substrate support unit 105 when the ALD process of forming the thin film on the substrates 50 is performed to control the gas supply unit 120 so that the deposition gases are alternately supplied to the substrates 50. Furthermore, the control unit 150 may selectively drive the first etching gas supply part 134, the first purge part 137, the second etching gas supply part 135, and the second purge part 136 while rotating the substrate support unit 105 when the ALE process is performed to control the gas supply unit 120 so that the etching gases are alternately supplied to the substrates 50.

In more detail, to perform the ALD process, the first deposition gas supply part 132 may supply a source gas S1 through the first deposition gas supply holes 132*a*, and the second deposition gas supply part 133 may supply a reaction gas S2, which reacts with the source gas S1 to form the thin film, through the second deposition gas supply holes 133*a*. When it intends to prevent the thin film formed by the ALD process from being damaged by plasma, each of the source gas S1 and the reaction gas S2 may be supplied in a non-plasma state.

The first purge part 137 and the second purge part 136 may be disposed between the deposition gas supply parts to purge or pump the source gas S1 or the reaction gas S2 so as to remove the source gas S1 or the reaction gas S2. For example, one of the first purge part 137 and the second purge part 136 may be disposed between the first deposition gas supply part 132 and the second deposition gas supply part 133, and the other one may be disposed between the second deposition gas supply part 133 and the first deposition gas supply part 132 in radial order.

In FIG. 4, for example, the first purge part 137 may be disposed between the first deposition gas supply part 132 and the second deposition gas supply part 133, and the second purge part 136 may be disposed between the second deposition gas supply part 133 and the first deposition gas supply part 132, and vice versa.

For example, to perform the ALE process, the second etching gas supply part 135 may supply a surface processing gas E2 for processing the surface of the thin film through the second etching gas supply hoes 135a, and the first etching gas supply part 134 may supply an etching gas E1, which reacts with the surface-processed portion of the thin film to generate a volatile compound, through the first etching gas supply holes 134a. When it intends to prevent the thin film etched by the ALE process from being damaged by plasma, each of the surface processing gas E2 and the etching gas E1 may be supplied in a non-plasma state. In some embodiments, the second etching gas supply part 135 may further include an E-beam supply part for radicalizing the surface processing gas E2 to improve surface processing efficiency.

The first purge part 137 and the second purge part 136 may be disposed between the etching gas supply parts to purge the surface processing gas E2 or the etching gas E1 so as to remove the surface processing gas E2 or the etching gas E1. For example, one of the first purge part 137 and the second purge part 136 may be disposed between the first etching gas supply part 134 and the second etching gas supply part 135, and the other one may be disposed between the second etching gas supply part 135 and the first etching gas supply part 134 in radial order.

In FIG. 3, for example, the first purge part 137 may be disposed between the first etching gas supply part 134 and the second etching gas supply part 135, and the second purge part 136 may be disposed between the second etching gas supply part 135 and the first etching gas supply part 134, and vice versa. Also, although the first deposition gas supply part 132 and the first etching gas supply part 134 are adjacent to each other, and the second deposition gas supply part 133 and the second etching gas supply part 135 are disposed adjacent to each other in FIG. 3, their positions may be changed as long as the above-described configuration is followed.

Alternatively, a plurality of curtain gas supply holes 131 may be defined in the curtain gas supply part 131 to supply a curtain gas C1 so as to prevent the adjacent gases from being maxed with each other at a central portion thereof. The curtain gas may include an inert gas.

Figure 5:
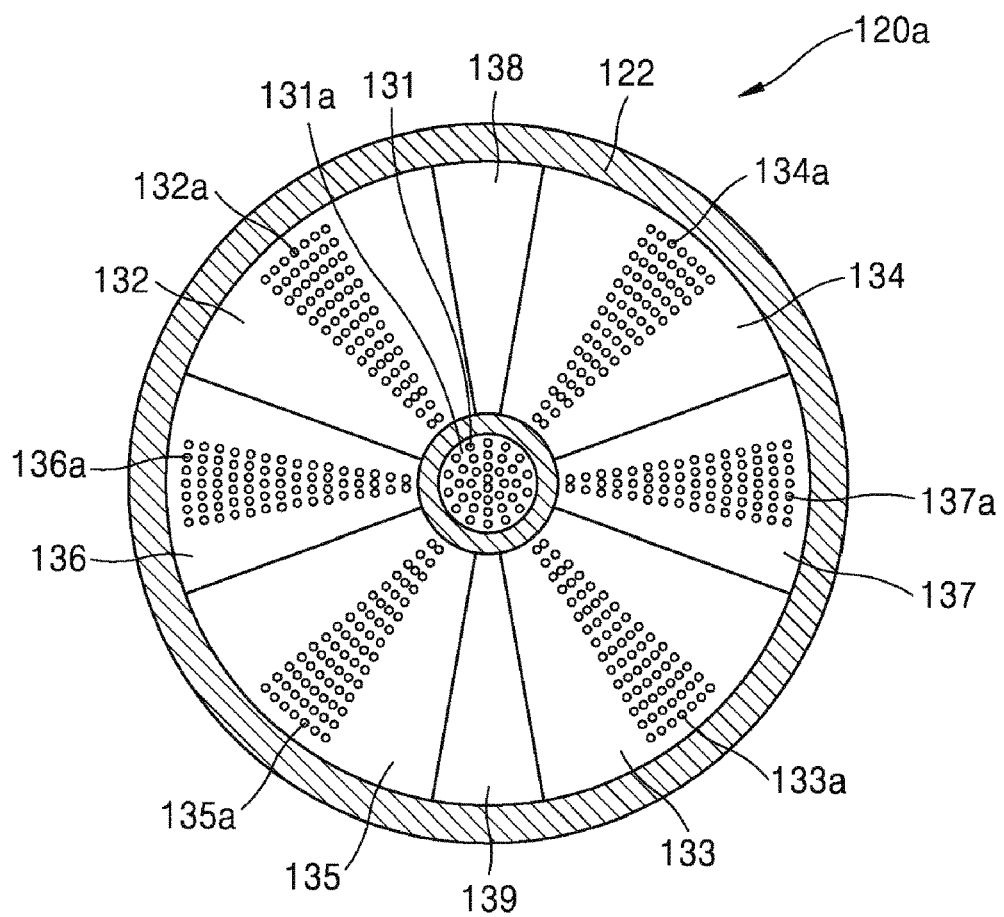
FIG. 5 is a schematic plan view illustrating a modified example of the gas supply unit of FIG. 4.

In a modified example, as illustrated in FIG. 5, first and second spacing parts 138 and 139 may be further provided in a gas supply unit 120a. For example, a first spacing part 138 may be provided between the first deposition gas supply part 132 and the first etching gas supply part 134 to space the first deposition gas supply part 132 from the first etching gas supply part 134, and the second spacing part 139 may be provided between the second deposition gas supply part 133 and the second etching gas supply part 135 to space the second deposition gas supply part 133 from the second etching gas supply part 135.

Each of the first and second spacing parts 138 and 139 may serve as a spacer for preventing the gases from being maxed with each other. Here, a separate gas may not be supplied, or an inert gas may be supplied. Each of the first and second spacing parts 138 and 139 may have a width less than that of each of the first purge part 137 and the second purge part 136.

In accordance with the forgoing some embodiments, the substrate processing apparatus 100 may include a chamber 110 providing a substrate processing space therein, a substrate support unit 105 rotatably installed in the chamber to radially seat a plurality of substrates on an upper portion thereof in a rotating direction, a gas supply unit 120 installed in the chamber 110 to face the substrate support unit 105 so as to supply a plurality of gases to the substrate support unit 105, and a control unit 150 controlling an operation of the substrate support unit 105 and the gas supply of the gas supply unit 120.

Figure 6:
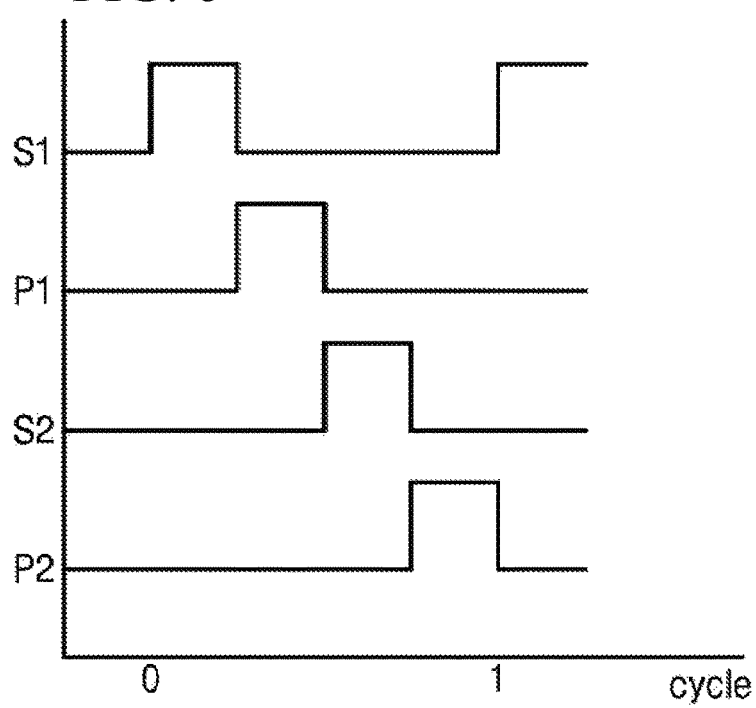
FIG. 6 is a schematic view illustrating a schematic process of supplying a gas to a substrate in the atomic layer deposition process in accordance with an embodiment.

FIG. 6 is a schematic view illustrating a schematic process of supplying a gas to the substrate in the atomic layer deposition process in accordance with embodiments.

Referring to FIG. 6, an ALD process may be performed by repeatedly performing a unit cycle including a process of supplying a source gas S1 to a substrate 50, a process of supplying a first purge gas P1 to the substrate 50, a process of supplying a reaction gas S2 to the substrate 50, and a process of supplying a second purge gas P2 to the substrate 50. That is, during the unit cycle, the source gas S1 is supplied and adsorbed to the substrate 50, the source gas S1 that is not adsorbed is purged by the first purge gas P1 and removed, the reaction gas S2 is supplied to react with the adsorbed source gas S1, and a residual reaction gas S2 is purged by the second purge gas P2 to form a unit thin film. The unit cycle may be repeatedly performed to form a thin film having a predetermined thickness.

For example, when the ALD process is performed in a time division manner, the source gas S1, the first purge gas P1, the reaction gas S2, the second purge gas P2 may be supplied to the substrate 50 in a pulse type in accordance with time.

For another example, when the ALD process is performed in a spatial division manner, referring to FIGS. 3 to 6, during the ALD process, in the gas supply unit 120, the first deposition gas supply part 132 may continuously inject the source gas S1, the second deposition gas supply part 133 may continuously inject the reaction gas S2, the first purge part 137 may continuously inject the first purge gas P1, and the second purge part 136 may continuously inject the second purge gas P2. However, since the substrate support unit 105 is rotated due to the characteristics of the spatial division manner, one substrate 50 may sequentially receive the gases rather than continuously receiving the gases.

For example, when each of a first thin film 60 and a second thin film 60a is used as a high-k dielectric film in a semiconductor memory device or to form a zirconium oxide film used as a blocking insulation film in a NAND flash memory, the first deposition gas supply part 132 may supply a gas containing a zirconium source gas as the source gas, and the second deposition gas supply part 133 may supply a gas containing an oxygen-based reaction gas, which reacts with the zirconium source gas to generate zirconium oxide, as the reaction gas. For example, the zirconium source gas may include Cp-Zr, and the oxygen-based reaction gas may include an ozone gas.

For another example, when each of a first thin film 60 and a second thin film 60a is used as a high-k dielectric film in a semiconductor memory device or to form an aluminum oxide film used as a blocking insulation film in a NAND flash memory, the first deposition gas supply part 132 may supply a gas containing an aluminum source gas as the source gas, and the second deposition gas supply part 133 may supply a gas containing an oxygen-based reaction gas, which reacts with the aluminum source gas to generate aluminum oxide, as the reaction gas. For example, the aluminum source gas may include a trimethylamine (TMA) gas, and the oxygen-based reaction gas may include an ozone gas.

Figure 7:
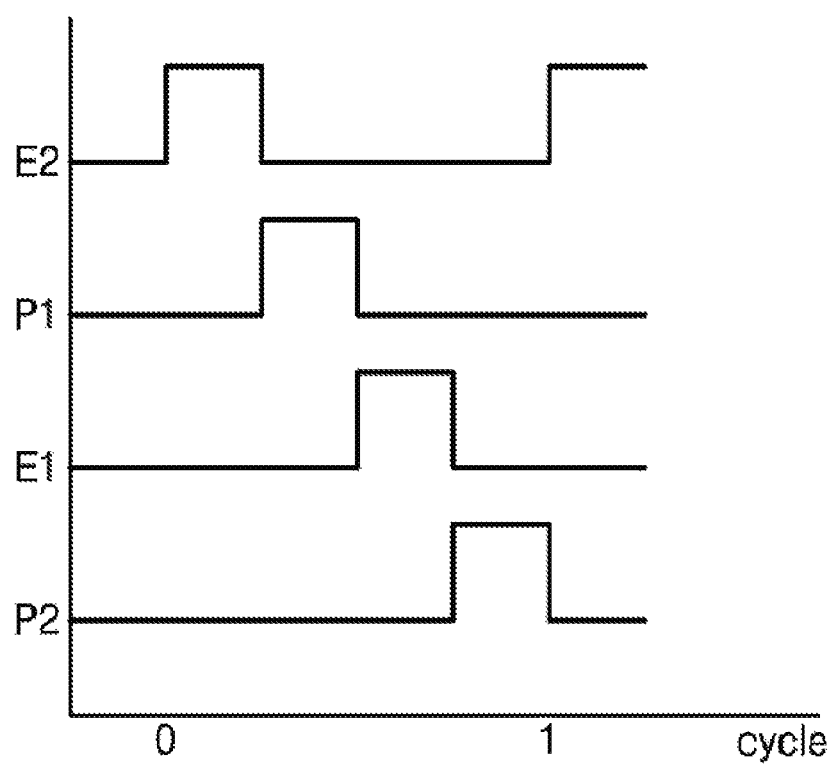
FIG. 7 is a schematic view illustrating a schematic process of supplying a gas to a substrate in the atomic layer etching process in accordance with an embodiment.

FIG. 7 is a schematic view illustrating a schematic process of supplying a gas to the substrate in the atomic layer etching process in accordance with embodiments.

Referring to FIG. 7, an ALE process may be performed by repeatedly performing a unit cycle including a process of supplying a surface processing gas E2 to the substrate 50, a process of supplying a first purge gas P1 to the substrate 50, a process of supplying an etching gas E1 to the substrate 50, and a process of supplying a second purge gas P2 to the substrate 50. That is, during the unit cycle, the surface processing gas E2 is supplied and adsorbed to the substrate 50 to the thin film to process a surface of the thin film, the surface processing gas E2 that is not adsorbed is purged by the first purge gas P1 and removed, the etching gas E1 is supplied to react with the surface-processed portion of the thin film, and a residual etching gas E1 is removed by the second purge gas P2 to etch a unit thin film. The unit cycle may be repeatedly performed to etch a thin film having a predetermined thickness.

For example, when the ALE process is performed in a time division manner, the surface processing gas E2, the first purge gas P1, the etching gas E1, the second purge gas P2 may be supplied to the substrate 50 in a pulse type in accordance with time.

For another example, when the ALE process is performed in a spatial division manner, referring to FIGS. 3, 4, and 7, during the ALE process, in the gas supply unit 120, the second etching gas supply part 135 may continuously inject the surface processing gas E2, and the first etching gas supply part 134 may continuously inject the etching gas E1. However, since the substrate support unit 105 rotates due to the characteristics of the spatial division manner, one substrate 50 may sequentially receive the gases rather than continuously receiving the gases.

For example, when each of the first thin film 60 and the second thin film 60a includes a zirconium oxide, the second etching gas supply part 135 may supply a gas containing a fluorine-based surface processing gas containing fluorine for surface-processing the zirconium oxide with zirconium fluoride, as the surface processing gas, and the first etching gas supply part 134 may supply a gas containing an organic reaction gas, which reacts with the zirconium fluoride to generate a volatile zirconium compound, as the etching gas. For example, the fluorine-based surface processing gas may include one selected from the group consisting of HF, NF$_3$, and F$_2$ or a combination thereof. The organic reaction gas may include a gas that contains methyl, chloride, or acac ligands and is capable of allowing ligands to undergo exchange reaction while being volatilized in a stable state, for example, one selected from the group consisting of trimethylamine (TMA), dimethylacetamide (DMAC), silicon tetrachloride (SiCl$_4$), and Sn(acac)$_2$ gases or a combination thereof.

For another example, when each of the first thin film 60 and the second thin film 60a includes an aluminum oxide, the second etching gas supply part 135 may supply a gas containing a fluorine-based surface processing gas for surface-processing the aluminum oxide with aluminum fluoride, as the surface processing gas, and the first etching gas supply part 134 may supply a gas containing an organic reaction gas, which reacts with the aluminum fluoride to generate a volatile aluminum compound, as the etching gas. For example, the fluorine-based surface processing gas may include one selected from the group consisting of HF, NF$_3$, and F$_2$ or a combination thereof. The organic reaction gas may include a gas that contains methyl, chloride, or acac ligands and is capable of allowing ligands to undergo exchange reaction while being volatilized in a stable state, for example, one selected from the group consisting of trimethylamine (TMA), dimethylacetamide (DMAC), silicon tetrachloride (SiCl$_4$), and Sn(acac)$_2$ gases or a combination thereof.

Figure 8:
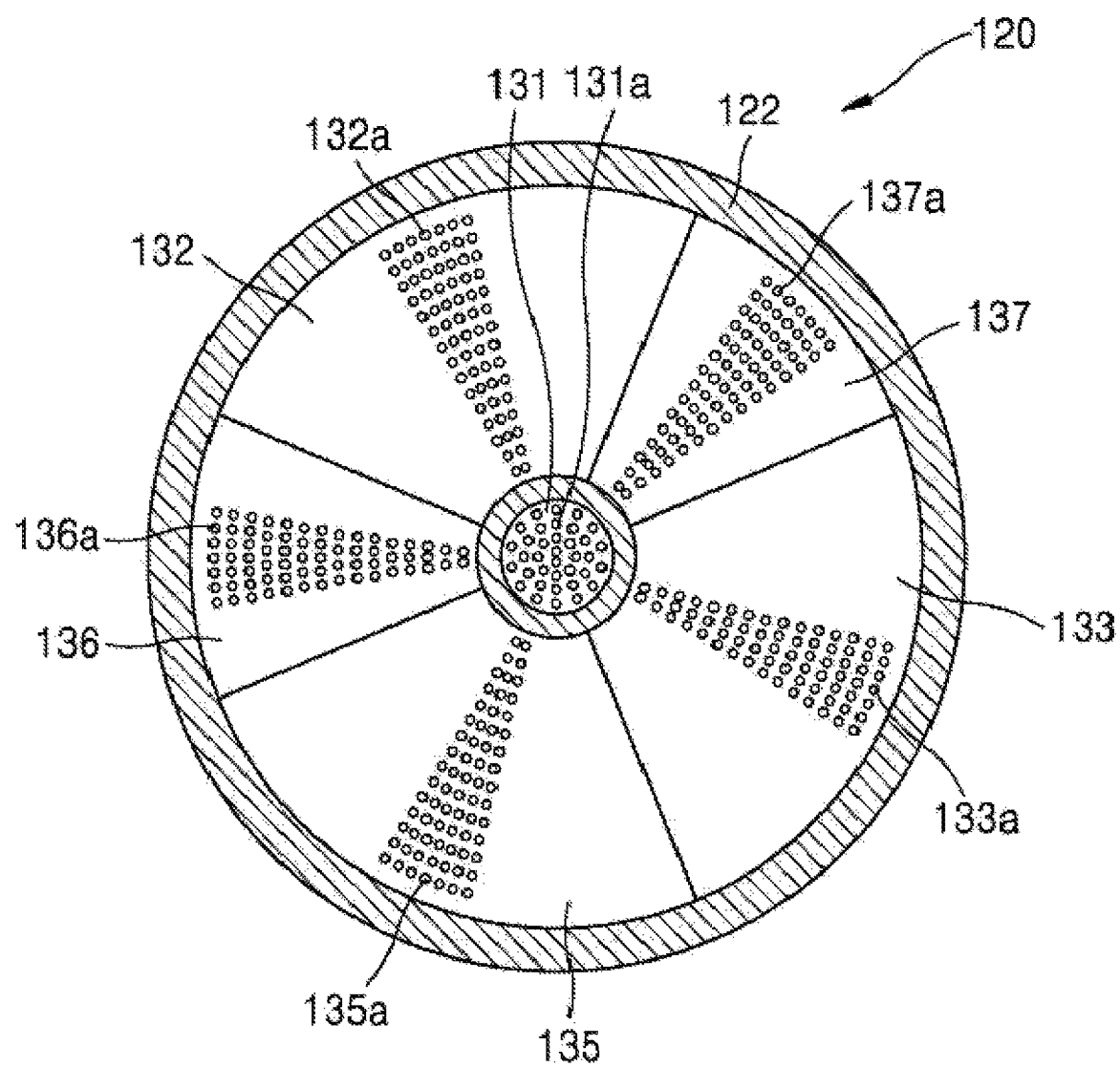
FIG. 8 is a schematic plan view illustrating another example of the gas supply unit of the substrate processing apparatus of FIG. 3.

In some embodiments, the fluorine-based surface processing gas may include an HF/NF$_3$ gas, and the organic reaction gas may include a trimethylamine (TMA) gas. In this case, since the aluminum source gas supplied from the first deposition gas supply part 132 and the organic reaction gas supplied from the first etching gas supply part 134 are the same as trimethylamine, the first deposition gas supply part 132 and the first etching gas supply part 134 may be combined into one gas supply part 132 as illustrated in FIG. 8. In FIG. 8, the first deposition gas supply part may be called a first process gas supply part 132, the second deposition gas supply part is called a second process gas supply part 133, and the second etching gas supply part 135 is called a third process gas supply part 135.

FIG. 8 is a schematic plan view illustrating another example of the gas supply unit of the substrate processing apparatus of FIG. 3.

Referring to FIG. 8, the gas supply unit 120 may include a first process gas supply part 132, a first purge part 137, a second process gas supply part 133, a third process gas supply part 135, and a second purge part 136, which are radially separated from each other. Alternatively, the gas supply unit 120 may further include a curtain gas supply part 131 at a central portion thereof.

A plurality of first deposition gas supply holes 132a may be defined in the first process gas supply part 132, and a plurality of second process gas supply holes 133a may be defined in the second deposition gas supply part 133. A plurality of third process gas supply holes 134a may be defined in the third process gas supply part 135, a plurality of purge holes 137a may be defined in the first purge part 137, and a plurality of second purge holes 136a may be defined in the second purge part 136.

For example, the gas supply unit 120 may have an approximately circular shape. The first process gas supply part 132, the first purge part 137, the second process gas supply part 133, the third process gas supply part 135, and the second purge part 136 may have a shape in which the circular gas supply unit 120 is divided into a circular arc shape. That is, the gas supply unit 120 may correspond to be spatially divided with respect to the substrates 50 on the rotating substrate support unit 150. In this sense, the substrate processing apparatus 100 may be referred to as a spatial division type facility.

The substrate processing apparatus 100 may be provided to selectively perform the ALD process and the ALE process. In this embodiment, since the first process gas supply part 132 is commonly used in the ALD process and the ALE process, the same gas may serve as the source gas and the etching gas.

Thus, in the ALD process, the first process gas supply part 132 and the second process gas supply part 133 may selectively operate. In the ALE process, the first process gas supply part 132 and the third process gas supply part 135 may selectively operate. Thus, in the ALD process, gas supply may be interrupted so that the third process gas supply part 135 does not operate. In the ALE process, gas supply may be interrupted so that the second process gas supply part 133 does not operate.

For example, the control unit 150 may selectively drive the first process gas supply part 132, the first purge part 137, the second process gas supply part 133, and the second purge part 136 while rotating the substrate support unit 105 when the ALD process of forming the thin film on the substrates 50 is performed to control the gas supply unit 120 so that the deposition gases are alternately supplied to the substrates 50. Furthermore, the control unit 150 may selectively drive the first process gas supply part 132, the first purge part 137, the third process gas supply part 135, and the second purge part 136 while rotating the substrate support unit 105 when the ALE process is performed to control the gas supply unit 120 so that the etching gases are alternately supplied to the substrates 50.

To perform the ALD process, the first process gas supply part 132 may supply a source gas (see reference symbol S1 of FIG. 6) through the first process gas supply holes 132a, and the second process gas supply part 133 may supply a reaction gas (see reference symbol S2 of FIG. 6), which reacts with the source gas S1 to form the thin film, through the second process gas supply holes 133a. When it intends to prevent the thin film formed by the ALD process from being damaged by plasma, each of the source gas S1 and the reaction gas S2 may be supplied in a non-plasma state.

The first purge part 137 and the second purge part 136 may be disposed between the deposition gas supply parts to purge the source gas S1 or the reaction gas S2 so as to remove the source gas S1 or the reaction gas S2. For example, one of the first purge part 137 and the second purge part 136 may be disposed between the first process gas supply part 132 and the second process gas supply part 133, and the other one may be disposed between the second process gas supply part 133 and the first process gas supply part 132 in radial order.

In FIG. 8, for example, the first purge part 137 may be disposed between the first process gas supply part 132 and the second process gas supply part 133, and the second purge part 136 may be disposed between the second process gas supply part 133 and the first process gas supply part 132, and vice versa.

To perform the ALE process, the third process gas supply part 135 may supply a surface processing gas E2 for processing the surface of the thin film through the third process gas supply hoes 135a, and the first process gas supply part 132 may supply an etching gas E1, which reacts with the surface-processed portion of the thin film to generate a volatile compound, through the first etching gas supply holes 132a. When it intends to prevent the thin film etched by the ALE process from being damaged by plasma, each of the surface processing gas E2 and the etching gas E1 may be supplied in a non-plasma state. In some embodiments, the third process gas supply part 135 may further include an E-beam supply part for radicalizing the surface processing gas E2 to improve surface processing efficiency.

The first purge part 137 and the second purge part 136 may be disposed between the etching gas supply parts to purge the surface processing gas E2 or the etching gas E1 so as to remove the surface processing gas E2 or the etching gas E1. For example, one of the first purge part 137 and the second purge part 136 may be disposed between the first process gas supply part 132 and the third process gas supply part 135, and the other one may be disposed between the third process gas supply part 135 and the first process gas supply part 132 in radial order.

In FIG. 8, for example, the first purge part 137 may be disposed between the first process gas supply part 132 and the third process gas supply part 135, and the second purge part 136 may be disposed between the third process gas supply part 135 and the first process gas supply part 132, and vice versa.

Alternatively, a plurality of curtain gas supply holes 131 may be defined in the curtain gas supply part 131 to supply a curtain gas C1 so as to prevent the adjacent gases from being maxed with each other at a central portion thereof. The curtain gas may include an inert gas.

Figure 9:
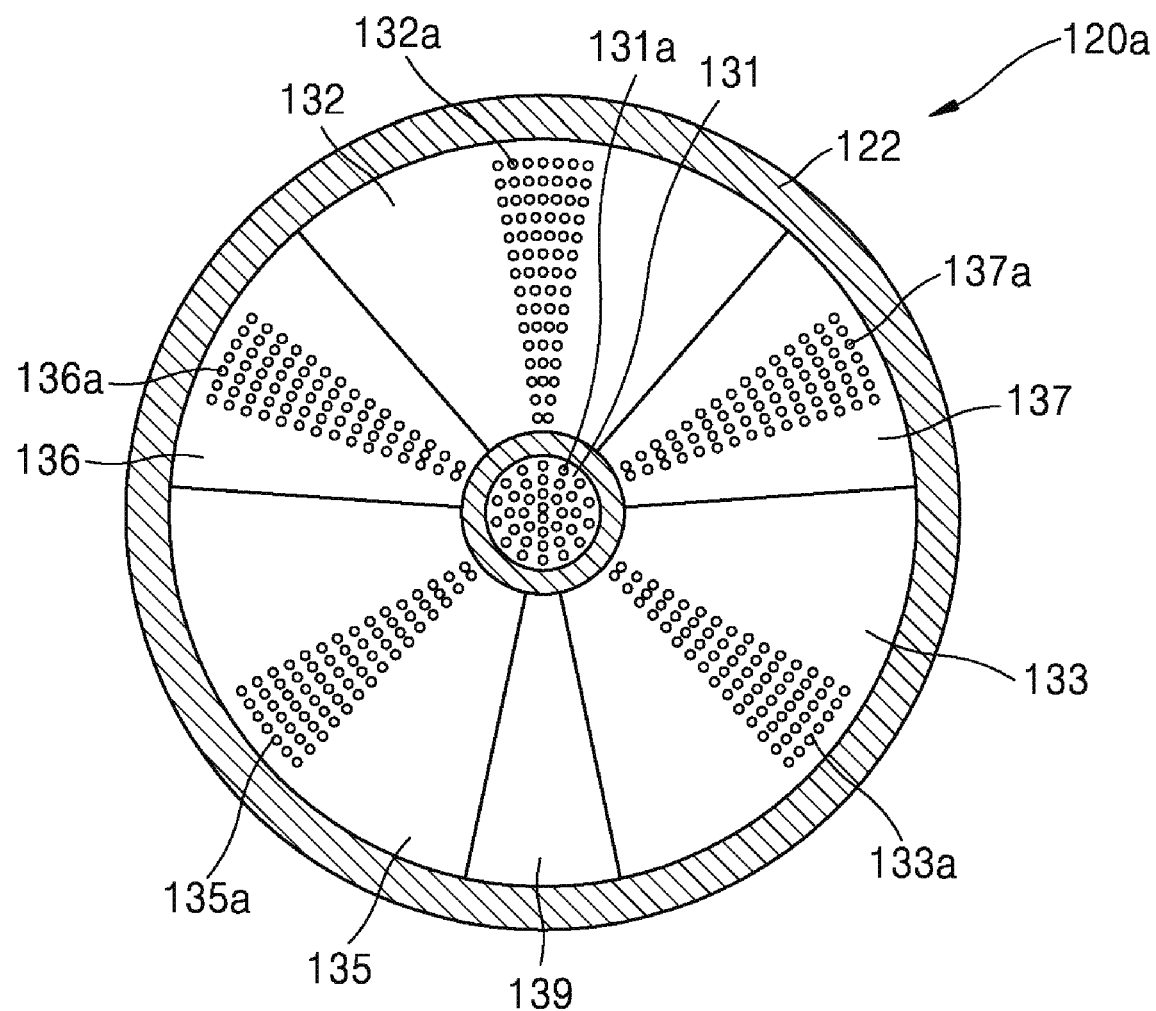
FIG. 9 is a schematic plan view illustrating a modified example of the gas supply unit of FIG. 8.

In a further modified example, as illustrated in FIG. 9, a spacing part 139 may be further provided in a gas supply unit 120a. For example, the spacing part 139 may be provided between the second deposition gas supply part 133 and the second etching gas supply part 135 to space the second deposition gas supply part 133 from the second etching gas supply part 135.

The spacing part 139 may serve as a spacer for preventing the gases from being maxed with each other. Here, a separate gas may not be supplied, or an inert gas may be supplied. The spacing part 139 may have a width less than that of each of the first purge part 137 and the second purge part 136.

Although only the spacing part 139 is illustrated in FIG. 9, the spacing part 139 may be provided in various manners. For example, the spacing part 139 may be provided in one or all of a portion between the first process gas supply part 132 and the second purge part 136 and a portion between the first process gas supply part 132 and the first purge part 137.

In the foregoing embodiments, when the ALD process and the ALE process are performed, although the first purge part 137 and the second purge part 136 are commonly used, the first and second purge parts 137 and 136 may be separately used or may be provided in plurality so that the plurality of purge parts are separately used in the ALD process and the ALE process.

In accordance with the forgoing embodiments, it is economical because the ALD process and the ALE process are performed in one chamber. Furthermore, when the ALD process and the ALE process are performed at the same temperature or temperatures similar to each other, the processes may be continuously performed without changing the temperature to enable efficient process progress.

Figure 10:
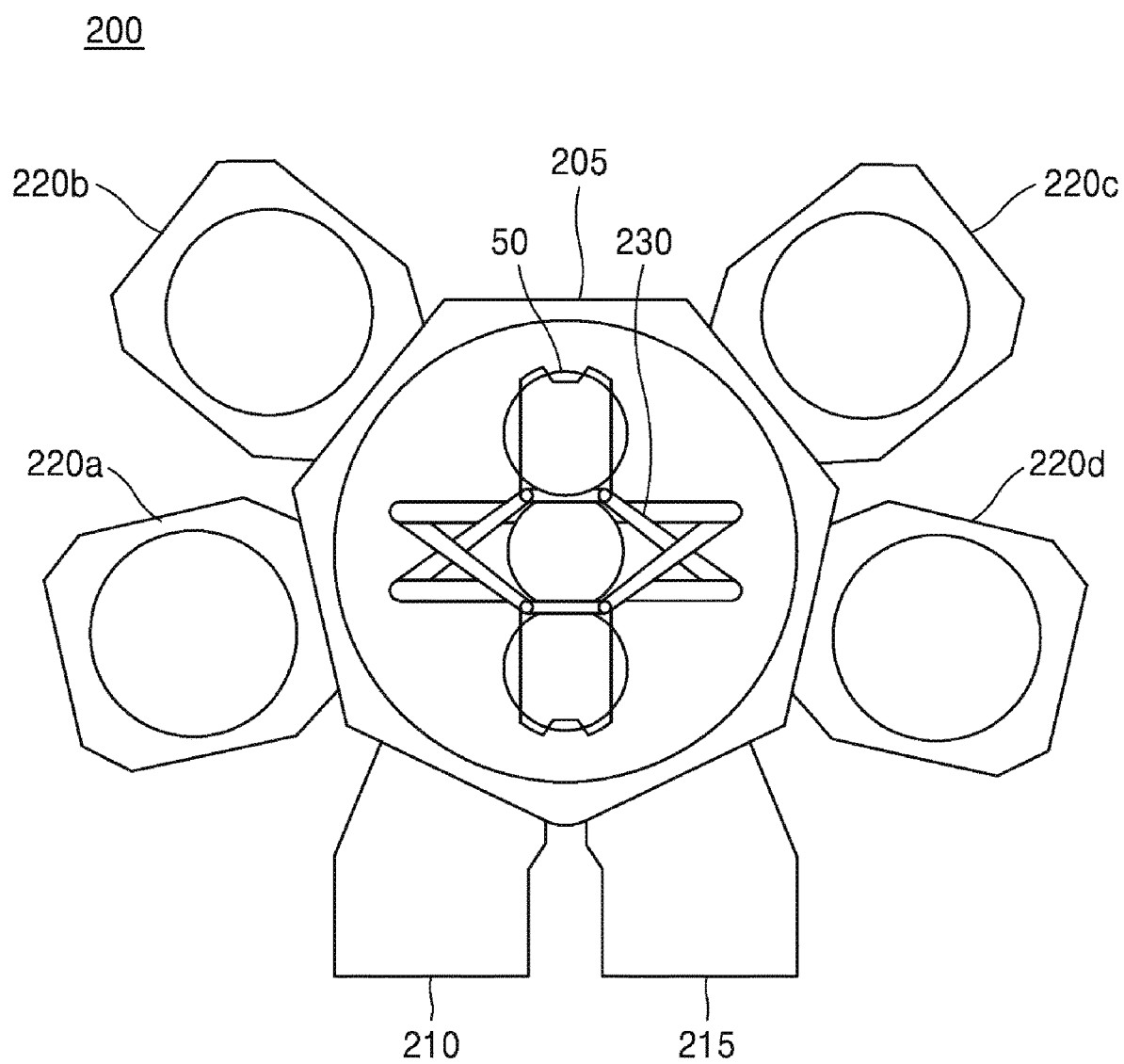
FIG. 10 is a schematic plan view of a substrate processing apparatus for realizing a method for forming a thin film in accordance with another embodiment.

FIG. 10 is a schematic plan view of a substrate processing apparatus for realizing a method for forming a thin film in accordance with another embodiment.

Referring to FIG. 1, a substrate processing apparatus 200 may include a load chamber 210, an unload chamber 215, a transfer chamber 205, and a plurality of process chambers 220a, 220b, 220c, and 220d. The substrate processing apparatus 200 may be called a cluster type apparatus.

The load chamber 210 may be a chamber into which a substrate is loaded from the outside, and the unload chamber 215 is a chamber from which a substrate is unloaded to the outside. The transfer chamber 205 is connected to the load chamber 210, the unload chamber 215, and the process chambers 220a, 220b, 220c, and 220d through gates (not shown) under a vacuum environment. The number of process chambers 220a, 220b, 220c, and 220d may be illustrative and may be suitably modified. A transfer robot 230 may be installed in the transfer chamber 205 to transfer the substrate 50 between the load chamber 210, the unload chamber 215, and the process chambers 220a, 220b, 220c, and 220d.

In accordance with this embodiment, an ALD process for forming a first thin film 60 on the substrate 50 may be performed in a first process chamber that is at least one of the process chambers 220a, 220b, 220c, and 220d, and an ALE process of etching the first thin film 60 by a predetermined thickness to form a second thin film 60a may be performed in a second process chamber that is at least the other one of the process chambers 220a, 220b, 220c, and 220d.

Hereinafter, a case in which the ALD process may be performed in the process chamber 220a, and the ALE is performed in the process chamber 220b will be described as an example. In this case, the process chamber 220a may be called a first process chamber, and the process chamber 220b may be called a second process chamber.

A method for forming a thin film by using the substrate processing apparatus 200 will be described as follows. The substrate 50 may be transferred into the first process chamber 220a, and a first thin film 60 having a first thickness H1 with first crystallinity may be formed on the substrate 50 through the ALD process. For example, a process of transferring the substrate 50 into the first process chamber 220a may include a process of loading the substrate 50 into the load chamber 210 and a process of transferring the substrate 50 from the load chamber 210 into the first process chamber 220a via the transfer chamber 205 under the vacuum environment.

Subsequently, the substrate 50 is transferred into the second process chamber 220b, which is different from the first process chamber 220a, within the substrate processing apparatus 200. For example, the process of transferring the substrate 50 into the second process chamber 220b may be performed by transferring the substrate 50 from the first process chamber 220a into the second process chamber 220b via the transfer chamber under the vacuum environment. Subsequently, the first thin film 60a may be etched by a predetermined thickness through the ALE process in the second process chamber 220b to form a second thin film 60a having a second thickness H2 that is less than the first thickness.

Detailed descriptions with respect to the ALD process and the ALE process using the substrate processing apparatus 200 may be referred to the above-described description of FIGS. 6 and 7.

This embodiment is efficient because the ALD process and the ALE process are continuously performed within the substrate processing apparatus 200 while maintaining the vacuum environment to prevent the first thin film 60 and the second thin film 60a from being damaged or contaminated.

Figure 11:
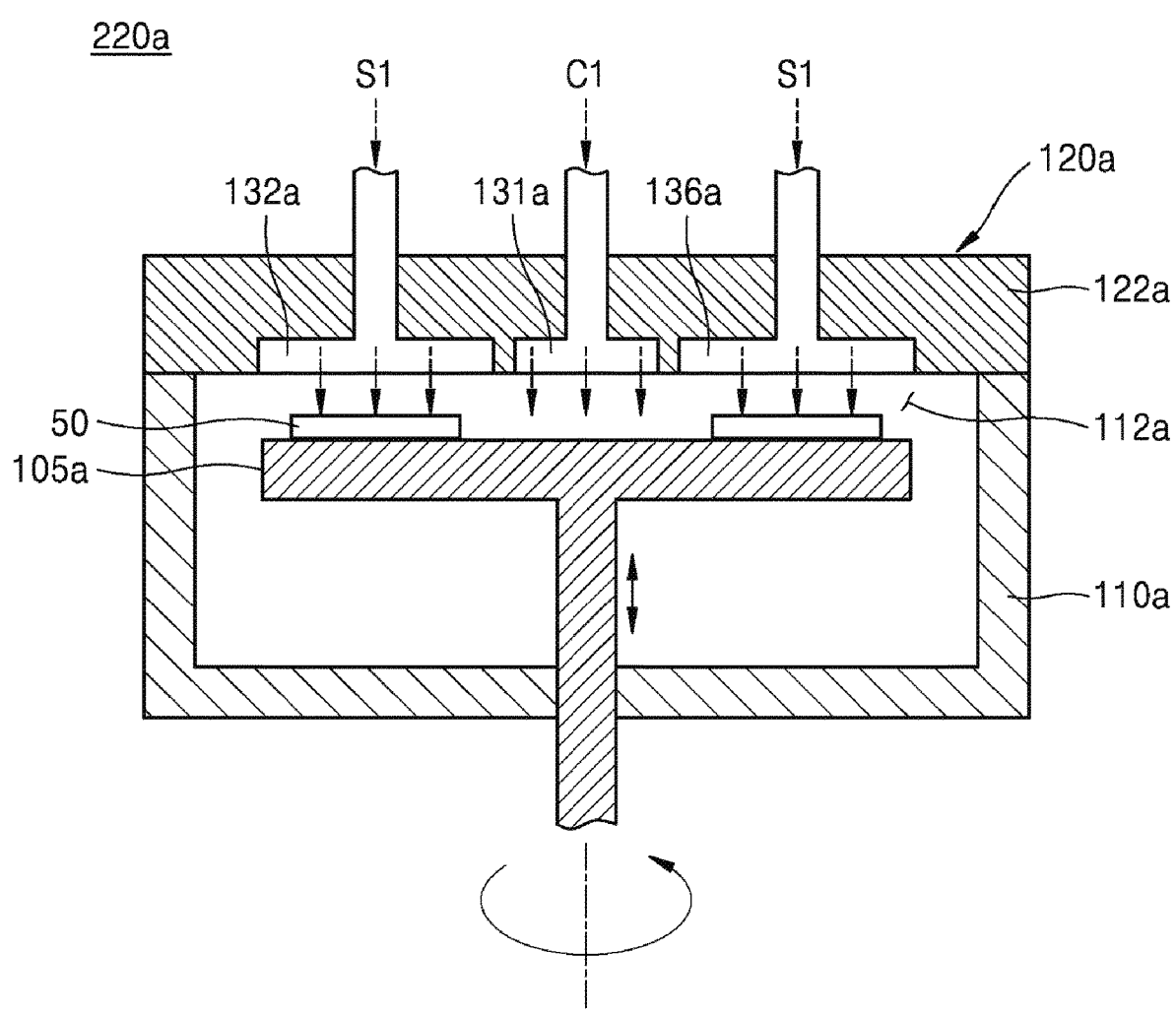
FIG. 11 is a schematic cross-sectional view illustrating an example of a first process chamber of the substrate processing apparatus of FIG. 10.

FIG. 11 is a schematic cross-sectional view illustrating an example of the first process chamber of the substrate processing apparatus of FIG. 10.

Referring to FIG. 1, the first process chamber 220a may include a first chamber body 110a, a first substrate support unit 105a, and a first gas supply unit 120a.

The first chamber body 110a may provide a first substrate processing space 112a therein. For example, the first substrate processing space 112a of the first chamber body 110a may be connected to a pumping unit (not shown) to provide a vacuum environment.

The first substrate support unit 105a may be rotatably installed in the first chamber body 110a, and a plurality of substrates 50 may be radially seated on an upper portion of the substrate support unit 105 in a rotating direction. For example, the first substrate support unit 105a may include a shaft part coupled to be sealed from the outside to the inside of the first chamber body 110a and receiving rotation power so as to be rotated and an upper plate part coupled to the shaft part. Seating grooves in which substrates 50 are seated may be radially disposed in the upper plate part. When the substrates 50 are wafers, each of the seating grooves may have a circular shape.

The first gas supply part 120a may be installed in the first chamber body 110a to face the first substrate support unit 105a so that a plurality of gases are supplied to the first substrate support unit 105a. For example, the first gas supply unit 120a may include a first main body 122a having a shower head shape, and the first main body 122a may be coupled to an upper portion of the first chamber body 110a.

Figure 12:
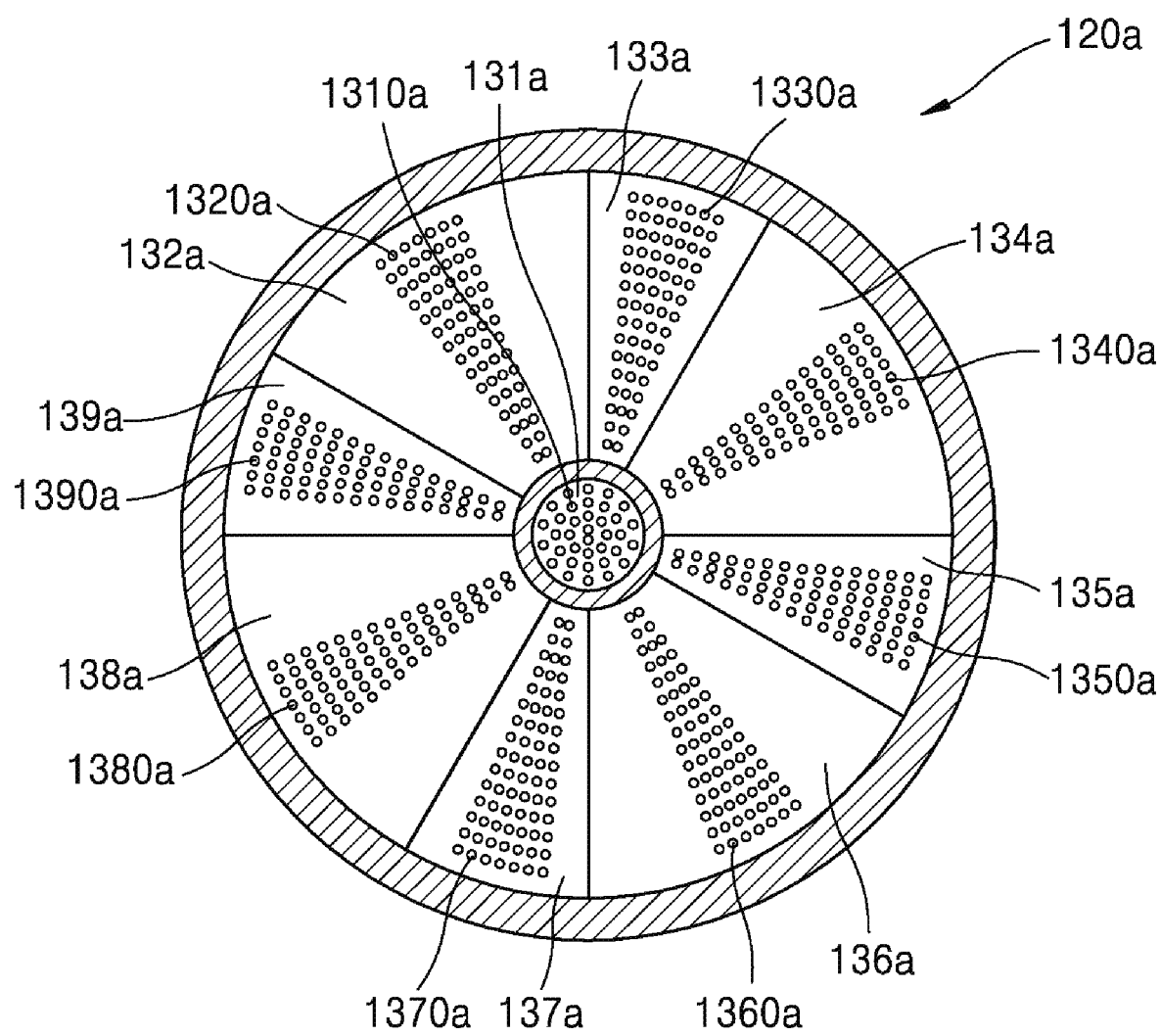
FIG. 12 is a schematic plan view illustrating a first gas supply unit of the first process chamber of FIG. 11.

FIG. 12 is a schematic plan view illustrating the first gas supply unit 120a of the first process chamber 220a of FIG. 11.

Referring to FIGS. 11 and 12, the first gas supply unit 120a may include a plurality of first process gas supply parts, for example, at least one first deposition gas supply parts 132a and 136a, at least one first purge parts 133a and 137a, at least one second deposition gas supply parts 134a and 138a, and at least one second purge parts 135a and 139a. Alternatively, the first gas supply unit 120a may further include a first curtain gas supply part 131a at a central portion thereof.

A plurality of first deposition gas supply holes 1320a may be defined in the first deposition gas supply part 132a, and a plurality of first deposition gas supply holes 1360a may be defined in the first deposition gas supply part 136a. A plurality of second deposition gas supply holes 1340a may be defined in the second deposition gas supply part 134a, and a plurality of second deposition gas supply holes 1380a may be defined in the second deposition gas supply part 138a. A plurality of first purge holes 1330a may be defined in the first purge part 133a, and a plurality of first purge holes 1370a may be defined in the first purge part 137a. A plurality of second purge holes 1350a may be defined in the second purge part 135a, and a plurality of second purge holes 1390a may be defined in the second purge part 139a.

For example, the first gas supply unit 120a may have an approximately circular shape. The first deposition gas supply parts 132a and 136a, the first purge parts 133a and 137a, the second deposition gas supply parts 134a and 138a, and the second purge parts 135a and 139a may have a shape in which the circular first gas supply unit 120a is divided into a circular arc shape. That is, the first gas supply unit 120a may correspond to be spatially divided with respect to the substrates 50 on the rotating first substrate support unit 105a. In this sense, the first process chamber 220a may be referred to as a spatial division type facility.

In the gas supply unit 120a, the first deposition gas supply part 132a, the first purge part 133a, the second deposition gas supply part 134a, the second purge part 135a, the first deposition gas supply part 136a, the first purge part 137a, the second deposition gas supply part 138a, and the second purge part 139a may be radially disposed in sequence. However, although the pair of first deposition gas supply parts 132a and 136a, first purge parts 133a and 137a, second deposition gas supply parts 134a and 138a, and second purge parts 135a and 139a are provided in this embodiment, this is illustrative. For example, one or plural first deposition gas supply parts, first purge parts, second deposition gas supply parts, and second purge parts may be provided in accordance with a modified example. That is, the number of parts is not limited thereto.

Hereinafter, the ALD process will be described with reference to FIGS. 6, 11, and 12.

To perform the ALD process, the first deposition gas supply parts 132a and 136a may supply a source gas S1 through the first deposition gas supply holes 1320a and 1360a, and the second deposition gas supply parts 134a and 138a may supply a reaction gas S2, which reacts with the source gas S1 to form the thin film, through the second deposition gas supply holes 1340a and 1380a. When it intends to prevent the thin film formed by the ALD process from being damaged by plasma, each of the source gas S1 and the reaction gas S2 may be supplied in a non-plasma state.

The first purge parts 133a and 137a may provide a first purge gas P1 to the substrate 50 through the first purge holes 1330a and 1370a to remove the remaining source gas S1, and the second purge parts 135a and 139a may provide a second purge gas P2 to the substrate 50 through the second purge holes 1350a and 1390a to remove the remaining reaction gas S2. For example, each of the first purge gas P1 and the second purge gas P2 may include an inert gas, for example, an argon gas, a nitrogen gas, and the like.

A plurality of first curtain gas supply holes 1310a may be defined in the first curtain gas supply part 131a to supply a first curtain gas C1 so as to prevent the adjacent gases from being maxed with each other at a central portion thereof. The first curtain gas C1 may include an inert gas, for example, an argon gas, a nitrogen gas, and the like.

In the above-described first gas supply unit 120a, spacing parts (not shown) may be further provided between the first deposition gas supply parts 132a and 136a, the first purge parts 133a and 137a, the second deposition gas supply parts 134a and 138a, and the second purge parts 135a and 139a.

Figure 13:
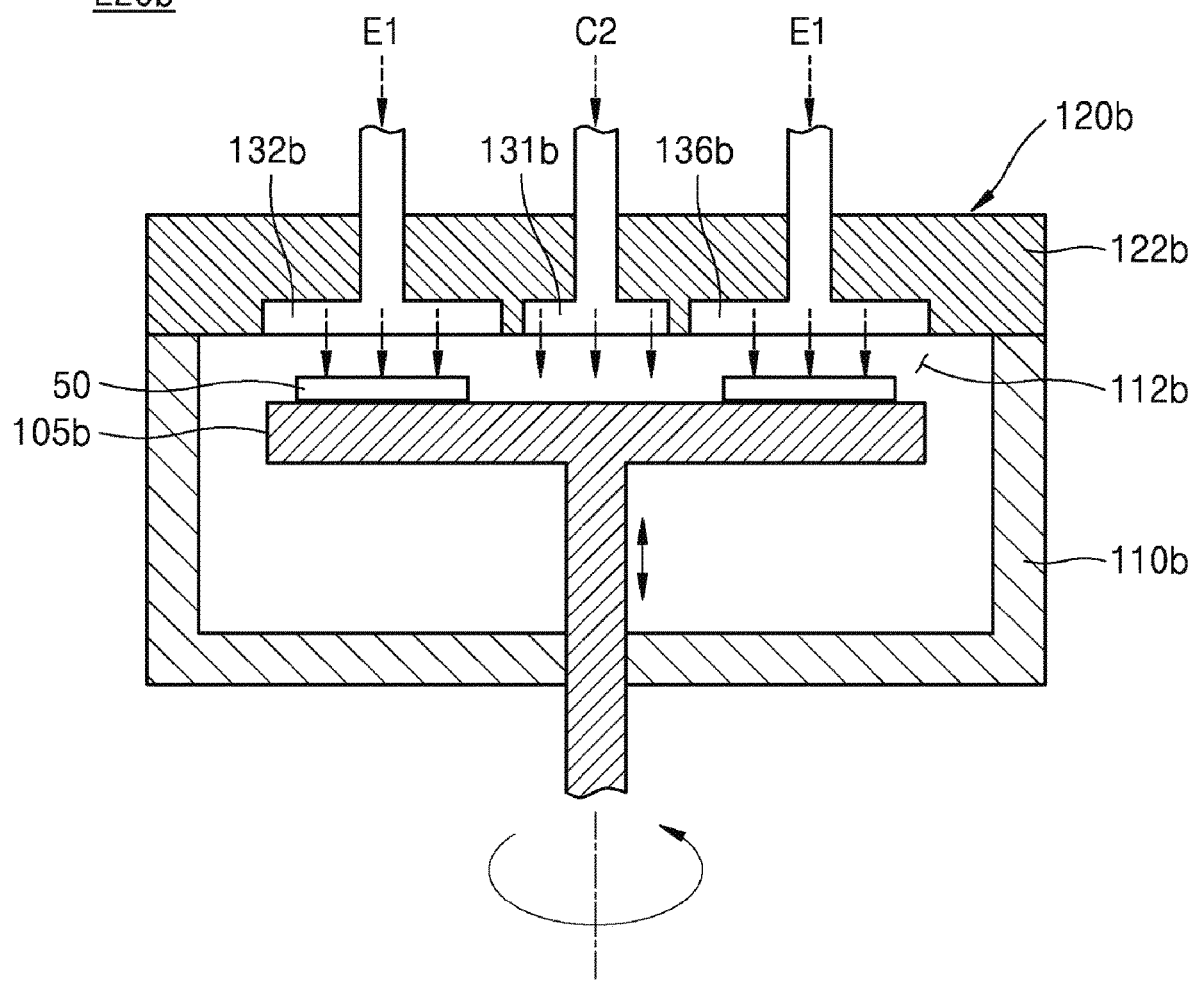
FIG. 13 is a schematic cross-sectional view illustrating an example of a second process chamber of the substrate processing apparatus of FIG. 10.

FIG. 13 is a schematic cross-sectional view illustrating an example of the second process chamber 220b of the substrate processing apparatus 200 of FIG. 10.

Referring to FIG. 13, the second process chamber 220a may include a second chamber body 110b, a second substrate support unit 105b, and a second gas supply unit 120b.

The second chamber body 110b may provide a second substrate processing space 112b therein. For example, the second substrate processing space 112b of the second chamber body 110b may be connected to a pumping unit (not shown) to provide a vacuum environment.

The second substrate support unit 105b may be rotatably installed in the second chamber body 110b, and a plurality of substrates 50 may be radially seated on an upper portion of the substrate support unit 105 in a rotating direction. For example, the second substrate support unit 105b may include a shaft part coupled to be sealed from the outside to the inside of the second chamber body 110b and receiving rotation power so as to be rotated and an upper plate part coupled to the shaft part. Seating grooves in which substrates 50 are seated may be radially disposed in the upper plate part. When the substrates 50 are wafers, each of the seating grooves may have a circular shape.

The second gas supply part 120b may be installed in the second chamber body 110b to face the second substrate support unit 105b so that a plurality of gases are supplied to the second substrate support unit 105b. For example, the second gas supply unit 120b may include a second main body 122b having a shower head shape, and the second main body 122b may be coupled to an upper portion of the second chamber body 110b.

Figure 14:
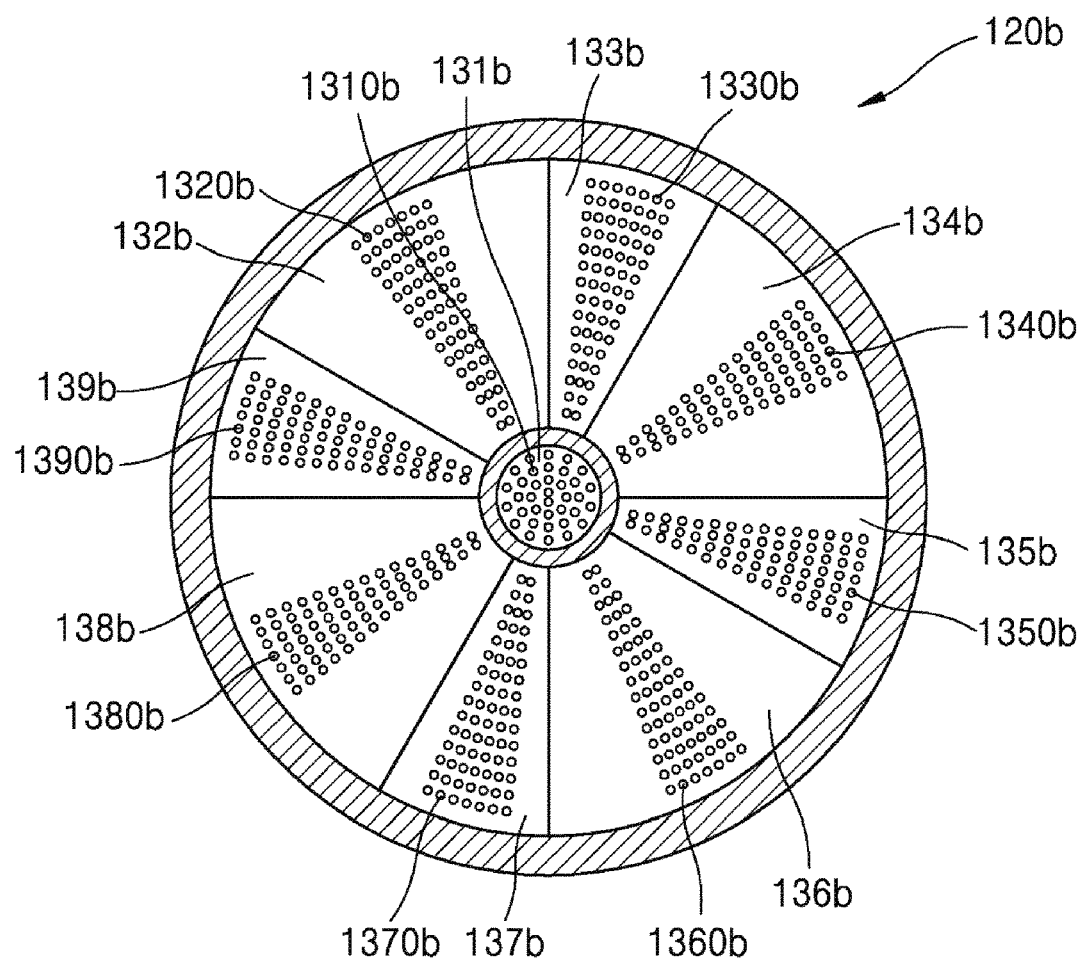
FIG. 14 is a schematic plan view illustrating a second gas supply unit of the second process chamber of FIG. 13.

FIG. 14 is a schematic plan view illustrating the second gas supply unit of the second process chamber of FIG. 13.

Referring to FIGS. 13 and 14, the second gas supply unit 120b may include a plurality of second process gas supply parts, for example, at least one first etching gas supply parts 132b and 136b, at least one third purge parts 133b and 137b, at least one second etching gas supply parts 134b and 138b, and at least one fourth purge parts 135b and 139b. Alternatively, the second gas supply unit 120b may further include a second curtain gas supply part 131b at a central portion thereof.

A plurality of first etching gas supply holes 1320b may be defined in the second etching gas supply part 132b, and a plurality of second etching gas supply holes 1360b may be defined in the second etching gas supply part 136b. A plurality of second etching gas supply holes 1340b may be defined in the second etching gas supply part 134b, and a plurality of second etching gas supply holes 1380b may be defined in the second etching gas supply part 138b. A plurality of third purge holes 1330b may be defined in the third purge part 133b, and a plurality of third purge holes 1370b may be defined in the third purge part 137b. A plurality of fourth purge holes 1350a may be defined in the fourth purge part 135b, and a plurality of fourth purge holes 1390b may be defined in the fourth purge part 139b.

For example, the second gas supply unit 120b may have an approximately circular shape. The first etching gas supply parts 132b and 136b, the third purge parts 133b and 137b, the second etching gas supply parts 134b and 138b, and the fourth purge parts 135b and 139b may have a shape in which the circular second gas supply unit 120b is divided into a circular arc shape. That is, the second gas supply unit 120b may correspond to be spatially divided with respect to the substrates 50 on the rotating second substrate support unit 150b. In this sense, the second processing chamber 220b may be referred to as a spatial division type facility.

In the second gas supply unit 120b, the first etching gas supply part 132b, the third purge part 133b, the second etching gas supply part 134b, the fourth purge part 135b, the first etching gas supply part 136b, the third purge part 137b, the second etching gas supply part 138b, and the fourth purge part 139b may be radially disposed in sequence. However, although the pair of first etching gas supply parts 132b and 136b, third purge parts 133b and 137b, second etching gas supply parts 134b and 138b, and fourth purge parts 135b and 139b are provided in this embodiment, this is illustrative. For example, one or plural first etching gas supply parts, third purge parts, second etching gas supply parts, and fourth purge parts may be provided in accordance with a modified example. That is, the number of parts is not limited thereto.

Hereinafter, the ALE process will be described with reference to FIGS. 7, 13, and 14.

To perform the ALE process, the first etching gas supply parts 132b and 136b may supply a surface processing gas E1 for processing a surface of a thin film through the first etching gas supply hoes 1320a and 1360b, and the second etching gas supply parts 134b and 138b may supply an etching gas E2, which reacts with the surface-processed portion of the thin film to generate a volatile compound, through the second etching gas supply holes 1340b and 1380b. When it intends to prevent the thin film etched by the ALE process from being damaged by plasma, each of the surface processing gas E1 and the etching gas E2 may be supplied in a non-plasma state. In some embodiments, each of the second etching gas supply parts 134b and 138b may further include an E-beam supply part for radicalizing the surface processing gas E2 to improve surface processing efficiency.

The third purge parts 133b and 137b may provide a third purge gas P3 to the substrate 50 through the third purge holes 1330b and 1370b to remove the remaining surface processing gas E1, and the fourth purge parts 1350b and 1390b may provide a fourth purge gas P4 to the substrate 50 through the fourth purge holes 1350b and 1390b to remove the remaining etching gas E2. For example, each of the third purge gas P3 and the fourth purge gas P4 may include an inert gas, for example, an argon gas, a nitrogen gas, and the like.

Alternatively, a plurality of second curtain gas supply holes 1310b may be defined in the second curtain gas supply part 131b to supply a second curtain gas C2 so as to prevent the adjacent gases from being maxed with each other at a central portion thereof. The second curtain gas C2 may include an inert gas, for example, an argon gas, a nitrogen gas, and the like.

In the above-described second gas supply unit 120b, spacing parts (not shown) may be further provided between the first etching gas supply parts 132b and 136b, the third purge parts 133b and 137b, the second etching gas supply parts 134b and 138b, and the fourth purge parts 135b and 139b.

Figure 15:
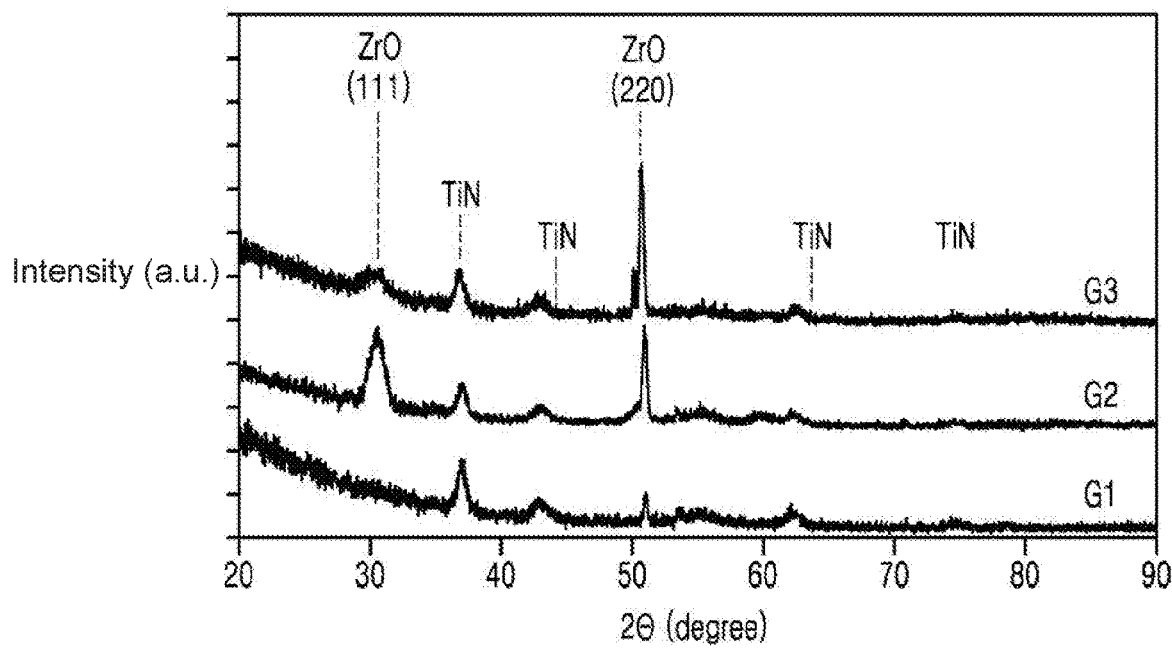
FIG. 15 is an x-ray diffraction (XRD) analysis graph illustrating crystallinity of a thin film formed in accordance with an experimental example and a comparative example.

FIG. 15 is an x-ray diffraction (XRD) analysis graph illustrating crystallinity of a thin film formed in accordance with an experimental example and a comparative example. In FIG. 15, a graph G1 represents a case in which a zirconium oxide film is formed at a second thickness H2 through an atomic layer deposition (ALD) process, a graph G2 presents a case a zirconium oxide film is formed at a first thickness H1 through the ALD process, and a graph G3 represents a case in which the zirconium oxide film having the first thickness H1 through the ALD process and then etched through an atomic layer etching (ALE) process so that the first thickness H1 is lowered to the second thickness H2.

Referring to FIG. 15, when the thin film is formed at the first thickness H1 through the ALD process as shown in the group G2, it is seen that crystallinity more increases than the case in which the thin film is formed at the second thickness H2 through the ALD process as shown in the graph G1. Furthermore, when the thin film having the first thickness H1 is formed through the ALD process and then etched through the ALE process so that the first thickness H1 is lowered to the second thickness H2 as shown in the graph G3, it is seen that the crystallinity more increases that the case in which original crystallinity is maintained so that the thin film having the second thickness H1 is formed from the beginning.

This result is useful for lowering leakage current by increasing the crystallinity while maintaining capacitance by lowering a thickness in a high-k film. That is, since it is difficult to adjust leakage current characteristics due to pore crystallinity of the thin film when the high-k film is formed at a low thickness from the beginning, when the thin film is etched to be adjusted in thickness in a state in which the thin film is formed at a predetermined thickness to increase in crystallinity, the capacitance may be maintained while maintaining the crystallinity.

For example, since the first thin film 60 has first crystallinity to secure the leakage current characteristics, and the second thin film 60a has second thickness to secure the capacitance characteristics, the second thin film 60a may secure the leakage current characteristics and the capacitance characteristics at the same time. For example, the second thin film 60a made of zirconium oxide may be used as a high-k thin film of a memory device. Thus, when the substrate processing apparatus 100 in accordance with the forgoing embodiment is used, a thin film that is capable of satisfying conflicting characteristics even in a thin film having a low thickness required in a highly integrated device.

For another example, the second thin film 60a may be used as a blocking oxide layer of the memory device. In the case of a charge trap memory device, it is necessary to suppress an occurrence of reverse tunneling from a control gate electrode to a charge trap layer in an erase operation. For this, a high-k film is used as a blocking insulation layer between the charge trap layer and the control gate electrode. Since the high-k film requires film quality that is thin and capable of suppressing the reverse tunneling, the second thin film 60a made of aluminum oxide may be used as the blocking insulation layer.

Furthermore, the second thin film 60a may be applied to a thin film in which a grain is grown to increase in crystallinity at a critical thickness or more, for example, a thin film made of zirconium oxide, aluminum oxide, or the like. Furthermore, the second thin film 60a may include a film in which a grain size increases as a thickness thereof increases, for example, a thin film made of polysilicon, zirconium oxide, or aluminum oxide. Furthermore, the second thin film 60a may be applied to a thin film having low resistivity at a critical thickness or more, for example, a thin film made of polysilicon, tungsten, or titanium nitride (TiN).

In accordance with the foregoing embodiments, when the atomic layer deposition (ALD) process and the atomic layer etching (ALE) process are performed, the conflicting physical properties even for the thin film having the thin thickness on the substrate may be secured. Of cause, the range of the present disclosure is not limited to the above-described effects.

The description of the present invention is intended to be illustrative, and those with ordinary skill in the technical field of the present invention pertains will be understood that the present invention can be carried out in other specific forms without changing the technical idea or essential features. Hence, the real protective scope of the present invention shall be determined by the technical scope of the accompanying claims.

What is claimed is:

1. A method of forming a thin film on a semiconductor device substrate, the method comprising:
   forming on the semiconductor device substrate, a first thin film having a first thickness with a first crystallinity using a predetermined atomic layer deposition process, the first thin film comprising a predetermined material; and
   after completion of the predetermined atomic layer deposition process, etching the first thin film to a predetermined second thickness using a predetermined atomic layer etching process to form a second thin film comprising the predetermined material and which has a second thickness less than the first thickness,
   wherein crystallinity of the second thin film is greater than crystallinity of a thin film formed from the same predetermined material, having substantially the same second thickness and which is formed using the same conditions used in the atomic layer deposition process, but which is not subjected to the atomic layer etching process.

2. The method of claim 1, wherein, both the atomic layer etching process and the atomic layer deposition process are performed in the same chamber and without removing the first thin film from the chamber after the atomic layer deposition process.

3. The method of claim 2, wherein the atomic layer deposition process and the atomic layer etching process are performed in the same chamber by alternately supplying a deposition gas and an etching gas through corresponding gas supply holes, which are separated from each other in a gas supply unit, while rotating the substrate, wherein the deposition gas flows into the chamber through a deposition gas supply hole and wherein the etching gas flows into the chamber through a separate and different etching gas supply hole.

4. The method of claim 1, wherein the atomic layer deposition process in the forming of the first thin film is performing by repeatedly performing a cycle comprising:
supplying a source gas to the substrate;
supplying a first purge gas to the substrate;
supplying a reaction gas to the substrate; and
supplying a second purge gas to the substrate.

5. The method of claim 4, wherein each of the first thin film and the second thin film comprises zirconium oxide, and the source gas comprises a zirconium source gas, and the reaction gas comprises an oxygen-based reaction gas, which reacts with the zirconium source gas to generate zirconium oxide.

6. The method of claim 5, wherein each of the first thin film and the second thin film comprises aluminum oxide, and the source gas comprises an aluminum source gas, and the reaction gas comprises an oxygen-based reaction gas, which reacts with the aluminum source gas to generate aluminum oxide.

7. The method of claim 1, wherein, in the forming of the second thin film, the atomic layer etching process is performing by repeatedly performing a unit cycle comprising:
supplying a surface processing gas to the substrate;
supplying a first purge gas to the substrate;
supplying an etching gas to the substrate; and
supplying a second purge gas to the substrate.

8. The method of claim 7, wherein each of the first thin film and the second thin film comprises zirconium oxide, the surface processing gas comprises a fluorine-based surface processing gas for surface-processing the zirconium oxide with zirconium fluoride, and the etching gas comprises an organic reaction gas, which reacts with the zirconium fluoride to generate a volatile zirconium compound.

9. The method of claim 8, wherein the fluorine-based surface processing gas comprises one selected from the group consisting of HF, NF3, and F2 or a combination thereof, and the organic reaction gas comprises one selected from the group consisting of trimethylamine (TMA), dimethylacetamide (DMAC), silicon tetrachloride (SiCl4), and Sn(acac)2 gases or a combination thereof.

10. The method of claim 7, wherein each of the first thin film and the second thin film comprises aluminum oxide, the surface processing gas comprises a fluorine-based surface processing gas for surface-processing the aluminum oxide with aluminum fluoride, and the etching gas comprises an organic reaction gas, which reacts with the aluminum fluoride to generate a volatile aluminum compound.

11. The method of claim 10, wherein the fluorine-based surface processing gas comprises one selected from the group consisting of HF, NF3, and F2 or a combination thereof, and the organic reaction gas comprises one selected from the group consisting of trimethylamine (TMA), dimethylacetamide (DMAC), silicon tetrachloride (SiCl4), and Sn(acac)2 gases or a combination thereof.

12. The method of claim 1, wherein, in the forming of the first thin film, the atomic layer deposition process is performed in a first process chamber within a substrate processing apparatus, and in the forming of the second thin film, the atomic layer etching process is performed in a second process chamber, which is different from the first process chamber, within the substrate processing apparatus.

13. The method of claim 12, further comprising, after the forming of the first thin film, transferring the substrate from the first process chamber to the second process chamber.

14. The method of claim 1, wherein the predetermined material comprises a dielectric material.

15. A method of forming on a semiconductor device substrate, a thin film for use by the semiconductor device, the method comprising:
transferring the substrate for a semiconductor device into a first process chamber within a substrate processing apparatus having a plurality of separate processing chambers, which are coupled to each other;
forming on the substrate, a first thin film having a first thickness with first crystallinity, the forming step comprising an atomic layer deposition process that is performed in the first process chamber;
transferring the substrate into a second process chamber, which is different from the first process chamber, but which is within the substrate processing apparatus; and
etching the first thin film in the second process chamber to thereby thin the first thin film by a predetermined thickness through an atomic layer etching process to and thereby form a second thin film having a second thickness less than the first thickness,
wherein substantially none of the semiconductor device substrate is itself etched by the atomic layer etching process;
wherein crystallinity of the second thin film is greater than crystallinity of a thin film formed from the same predetermined material, having substantially a second thickness and which is formed using the same conditions used in the atomic layer deposition process, but which is not subjected to the atomic layer etching process.

16. The method of claim 15, wherein the transferring of the substrate from the first processing chamber into the second process chamber is performed by transferring the substrate from the first process chamber into the second process chamber via a transfer chamber, which is connected to the first process chamber and the second process chamber within the substrate processing apparatus through gates, under a vacuum environment.

17. The method of claim 15, wherein, in the forming of the first thin film, the atomic layer deposition process is performing by repeatedly performing a unit cycle comprising:
supplying a source gas to the substrate;
supplying a first purge gas to the substrate;
supplying a reaction gas to the substrate; and
supplying a second purge gas to the substrate.

18. The method of claim 17, wherein the first process chamber comprises a first gas supply unit comprising a plurality of first process gas supply parts, which are radially separated from each other, and
the supplying of the source gas, the supplying of the first purge gas, the supplying of the reaction gas, and the supplying of the second purge gas within the unit cycle of the atomic layer deposition process are performed to sequentially supply the source gas, the first purge gas, the reaction gas, and the second purge gas to the substrate by rotating a first substrate support unit supporting the substrate while continuously supplying the source gas, the first purge gas, the reaction gas, and the second purge gas through gas supply holes of the plurality of first process gas supply parts within the first gas supply unit.

19. The method of claim 15, wherein, in the forming of the second thin film, the atomic layer etching process is performing by repeatedly performing a unit cycle comprising:
- supplying a surface processing gas to the substrate;
- supplying a third purge gas to the substrate;
- supplying an etching gas to the substrate; and
- supplying a fourth purge gas to the substrate.

20. The method of claim 19, wherein the second process chamber comprises a second gas supply unit comprising a plurality of second process gas supply parts, which are radially separated from each other, and the supplying of the surface processing gas, the supplying of the third purge gas, the supplying of the etching gas, and the supplying of the fourth purge gas within the unit cycle of the atomic layer etching process are performed to sequentially supply the surface processing gas, the third purge gas, the etching gas, and the fourth purge gas to the substrate by rotating a second substrate support unit supporting the substrate while continuously supplying the surface processing gas, the third purge gas, the etching gas, and the fourth purge gas through gas supply holes of the plurality of second process gas supply parts within the second gas supply unit.

* * * * *